United States Patent
Cousineau et al.

(10) Patent No.: US 11,388,840 B2
(45) Date of Patent: Jul. 12, 2022

(54) CONDENSERS AND ELECTRONIC ASSEMBLIES

(71) Applicants: Deere & Company, Moline, IL (US); Alliance for Sustainable Energy, LLC, Golden, CO (US)

(72) Inventors: Emily Cousineau, Lakewood, CO (US); Gilberto Moreno, Thornton, CO (US); Kevin Scott Bennion, Littleton, CO (US); Thomas Roan, Fargo, ND (US); Brij N. Singh, West Fargo, ND (US)

(73) Assignees: DEERE & COMPANY, Moline, IL (US); ALLIANCE FOR SUSTAINABLE ENERGY, LLC, Golden, CO (US)

( * ) Notice: Subject to any disclaimer, the term of this patent is extended or adjusted under 35 U.S.C. 154(b) by 0 days.

(21) Appl. No.: 16/870,320

(22) Filed: May 8, 2020

(65) Prior Publication Data
US 2021/0321537 A1 Oct. 14, 2021

Related U.S. Application Data

(60) Provisional application No. 63/009,789, filed on Apr. 14, 2020.

(51) Int. Cl.
*H05K 7/20* (2006.01)
*F25B 39/04* (2006.01)
(Continued)

(52) U.S. Cl.
CPC ......... *H05K 7/20318* (2013.01); *F25B 39/04* (2013.01); *F28D 15/0266* (2013.01);
(Continued)

(58) Field of Classification Search
CPC .......... H05K 7/20318; H05K 7/20145; H05K 7/20327; H05K 7/201722; H05K 7/20309;
(Continued)

(56) References Cited

U.S. PATENT DOCUMENTS 2,362,571 A * 11/1944 McCollum ............. B64D 13/08
126/116 R
2,372,079 A * 3/1945 Gunter .................... F28D 7/103
165/141

(Continued)

FOREIGN PATENT DOCUMENTS

DK 3052864 T3 3/2019

OTHER PUBLICATIONS

Extended European Search Report dated Jul. 26, 2021 issued in corresponding European Patent Application No. 21153940.8-1002.
(Continued)

*Primary Examiner* — Justin M Jonaitis
(74) *Attorney, Agent, or Firm* — Harness, Dickey & Pierce, P.L.C.

(57) ABSTRACT

Provided is a condenser for use in an electronic assembly. The condenser includes a first vertical wall extending in a vertical direction, the first vertical wall defining a first plurality of vertical condensation channels within the first vertical wall, a second vertical wall extending in the vertical direction, the second vertical wall defining a second plurality of vertical condensation channels within the second vertical wall, and a first plurality of fins extending in the vertical direction, each of the first plurality of fins connected to the first vertical wall, the second vertical wall or both the first vertical wall and the second vertical wall.

14 Claims, 18 Drawing Sheets

(51) Int. Cl.
*H01L 23/427* (2006.01)
*F28D 15/02* (2006.01)
*F28F 1/02* (2006.01)

(52) U.S. Cl.
CPC ....... *H01L 23/427* (2013.01); *H05K 7/20172* (2013.01); *H05K 7/20309* (2013.01); *F28F 1/022* (2013.01); *F28F 2215/02* (2013.01); *H05K 7/20145* (2013.01); *H05K 7/20327* (2013.01)

(58) Field of Classification Search
CPC ........ F25B 39/04; F28D 15/0266; F28D 1/00; F28D 7/00; F28D 9/00; H01L 23/427; F28F 1/022; F28F 2215/02; F28F 1/00; F28F 3/005; F28F 3/08
USPC ....... 165/207, 172, 164, 165, 166, 167, 154, 165/155
See application file for complete search history.

(56) References Cited

U.S. PATENT DOCUMENTS

| | | | | |
|---|---|---|---|---|
| 2,521,369 | A * | 9/1950 | Holm | F28D 7/103 165/141 |
| 2,875,986 | A * | 3/1959 | Holm | F28D 9/0068 165/145 |
| 3,180,405 | A * | 4/1965 | Hinde | F28D 7/1638 165/117 |
| 3,662,582 | A * | 5/1972 | French | F28F 1/42 72/370.17 |
| 3,818,984 | A * | 6/1974 | Nakamura | F28F 3/025 165/166 |
| 4,096,616 | A * | 6/1978 | Coffinberry | B21D 53/06 29/890.036 |
| 4,116,271 | A * | 9/1978 | De Lepeleire | F28D 9/0006 165/166 |
| 6,005,772 | A * | 12/1999 | Terao | F28D 15/0233 165/104.21 |
| 7,958,935 | B2 | 6/2011 | Belits et al. | |
| 10,153,226 | B1 | 12/2018 | Zou | |
| 10,278,305 | B2 | 4/2019 | Roan et al. | |
| 2003/0010477 | A1* | 1/2003 | Khrustalev | F28D 15/0266 165/104.33 |
| 2008/0236790 | A1* | 10/2008 | Bhatti | F28F 1/126 165/80.3 |
| 2009/0321060 | A1* | 12/2009 | Chou | F28F 1/022 165/185 |
| 2016/0123637 | A1 | 5/2016 | Moreno et al. | |
| 2017/0055377 | A1 | 2/2017 | Rice et al. | |
| 2017/0167798 | A1* | 6/2017 | Espersen | F28D 15/025 |
| 2018/0279508 | A1 | 9/2018 | Roan et al. | |

OTHER PUBLICATIONS

Extended European Search Report dated Jul. 26, 2021 issued in corresponding European Patent Application No. 21153933.3-1002.

* cited by examiner

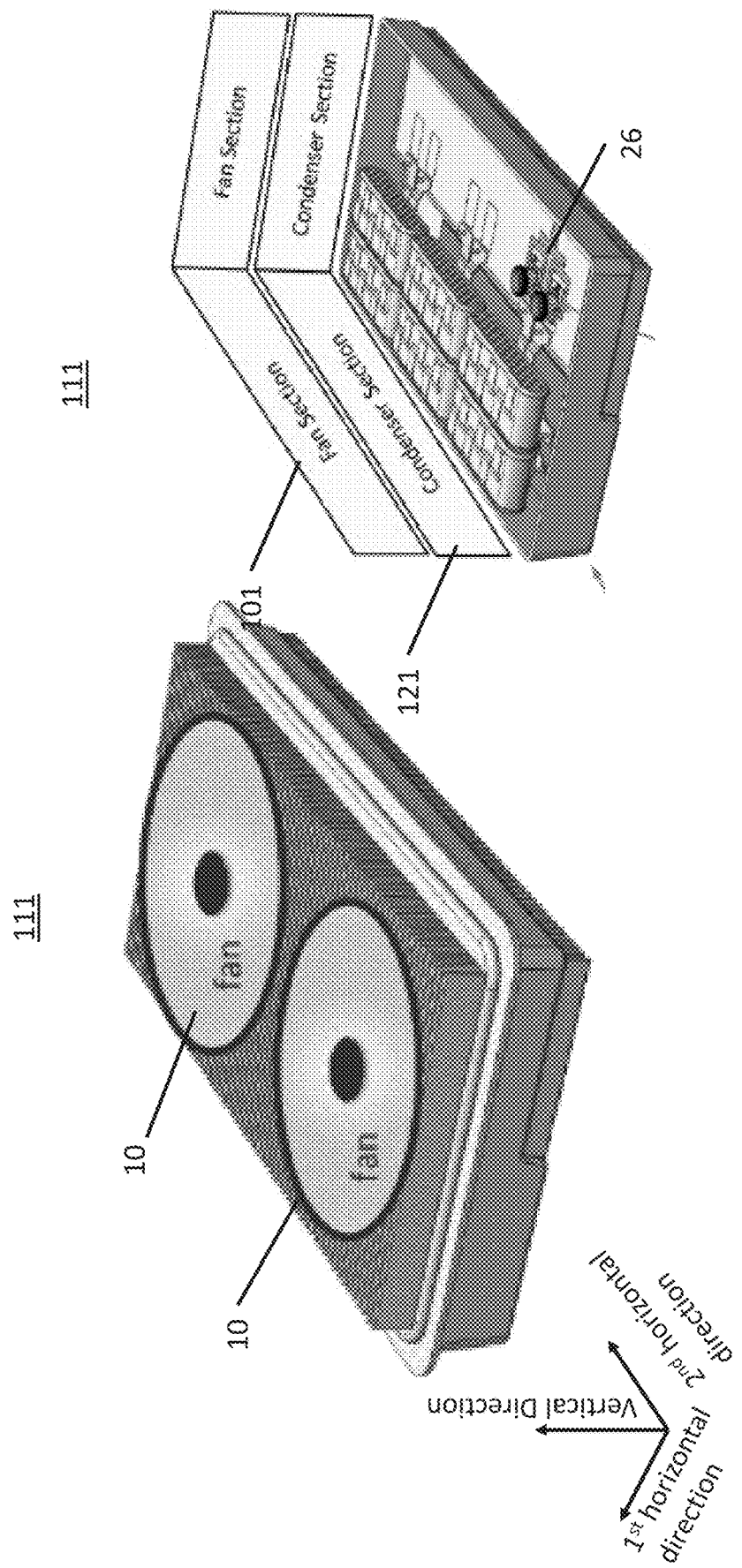

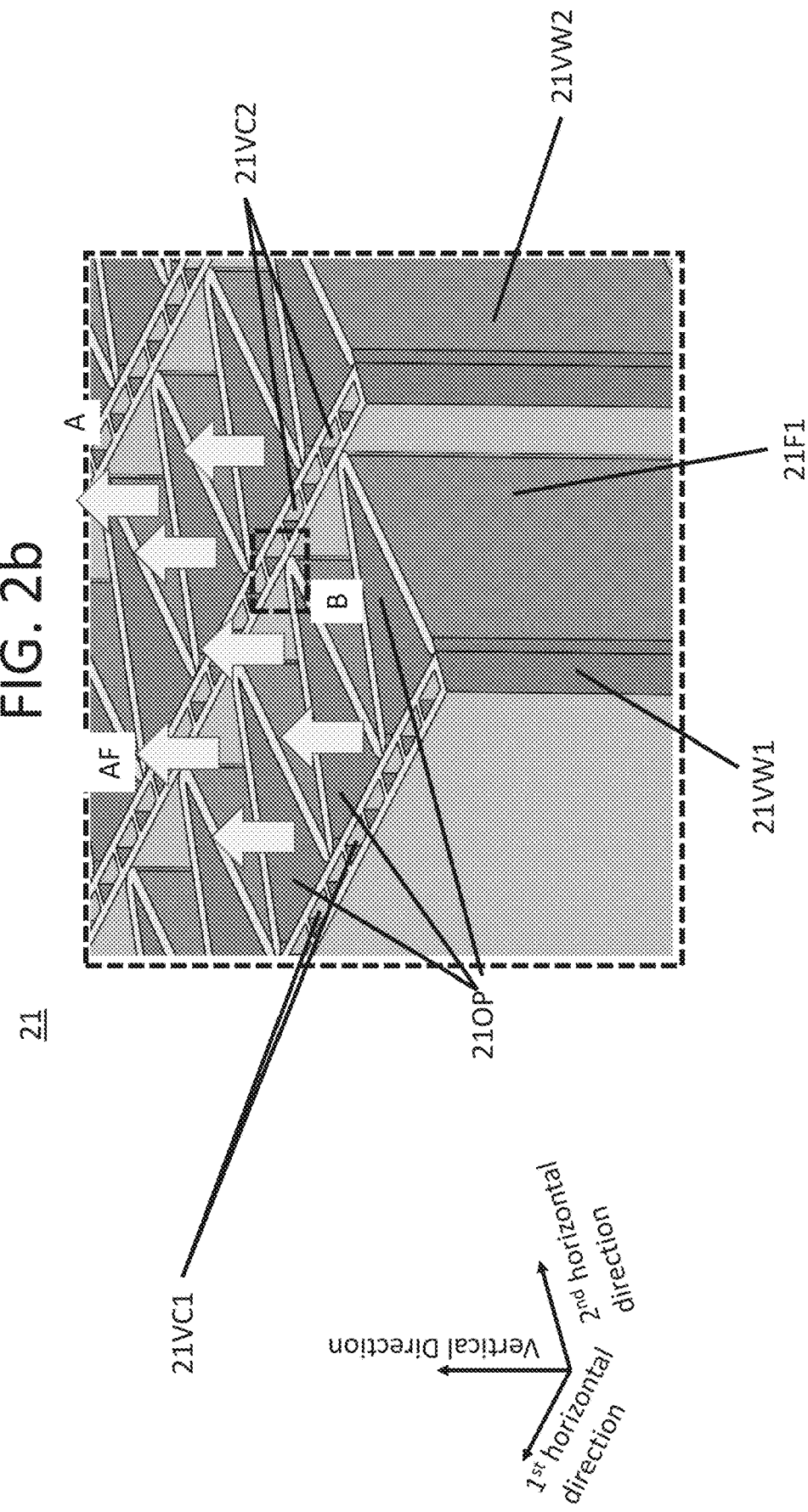

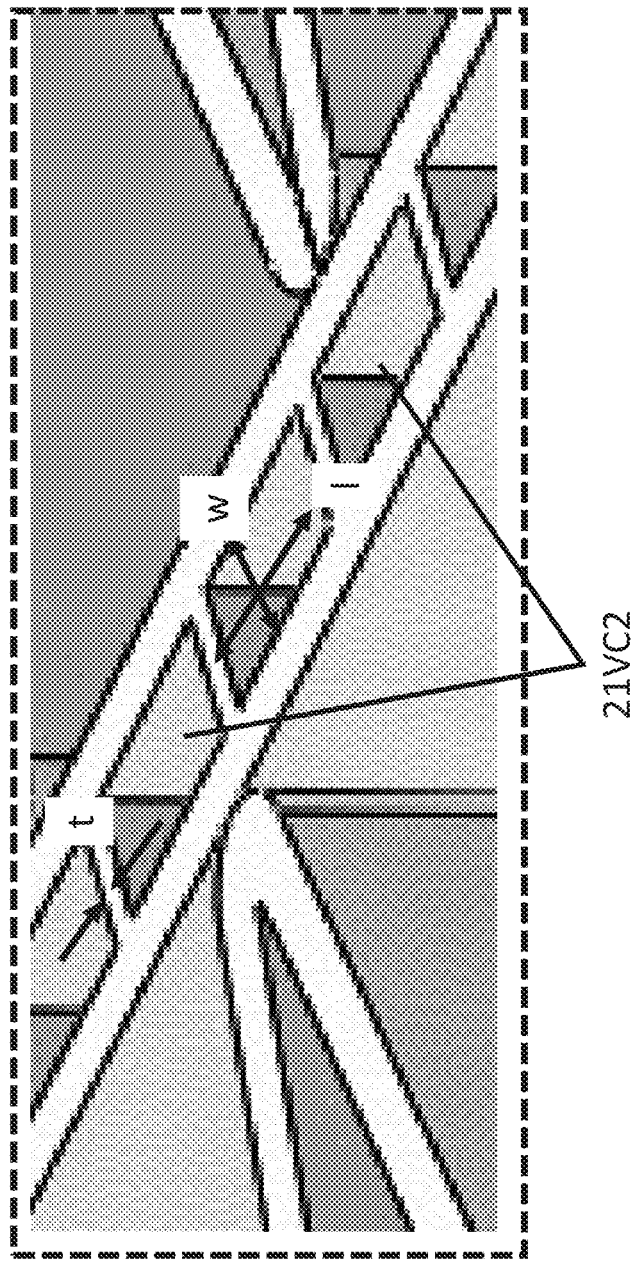

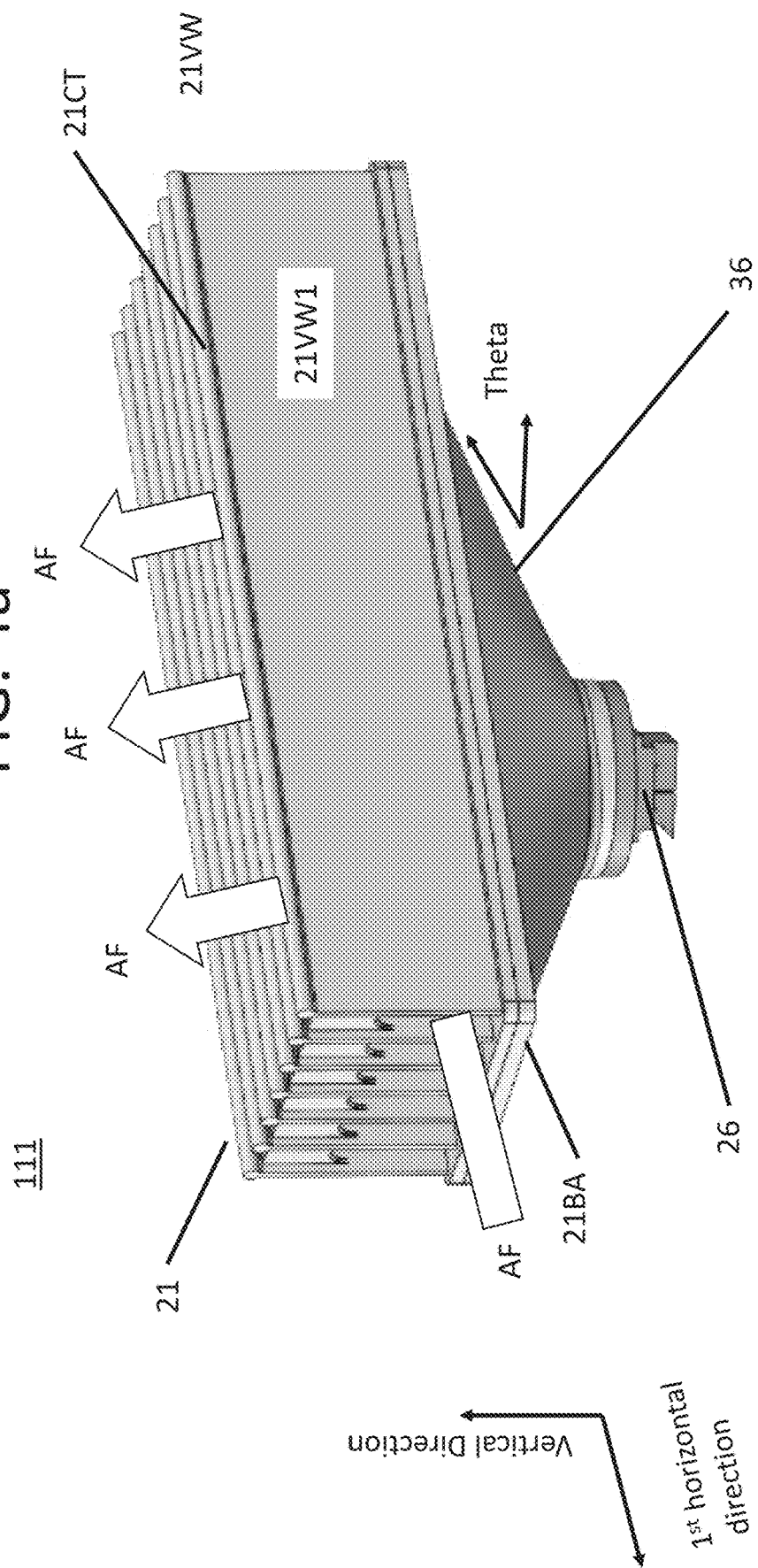

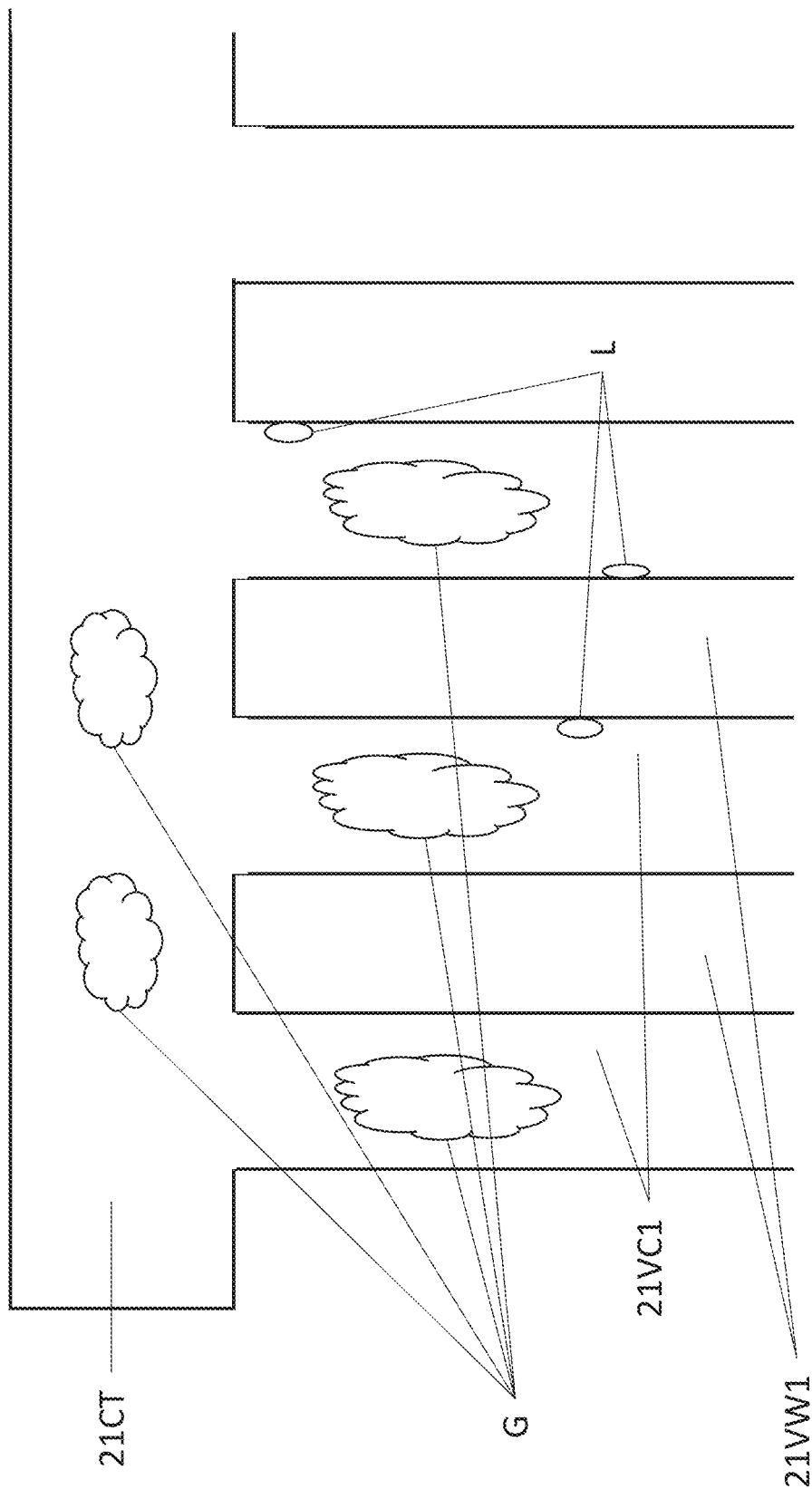

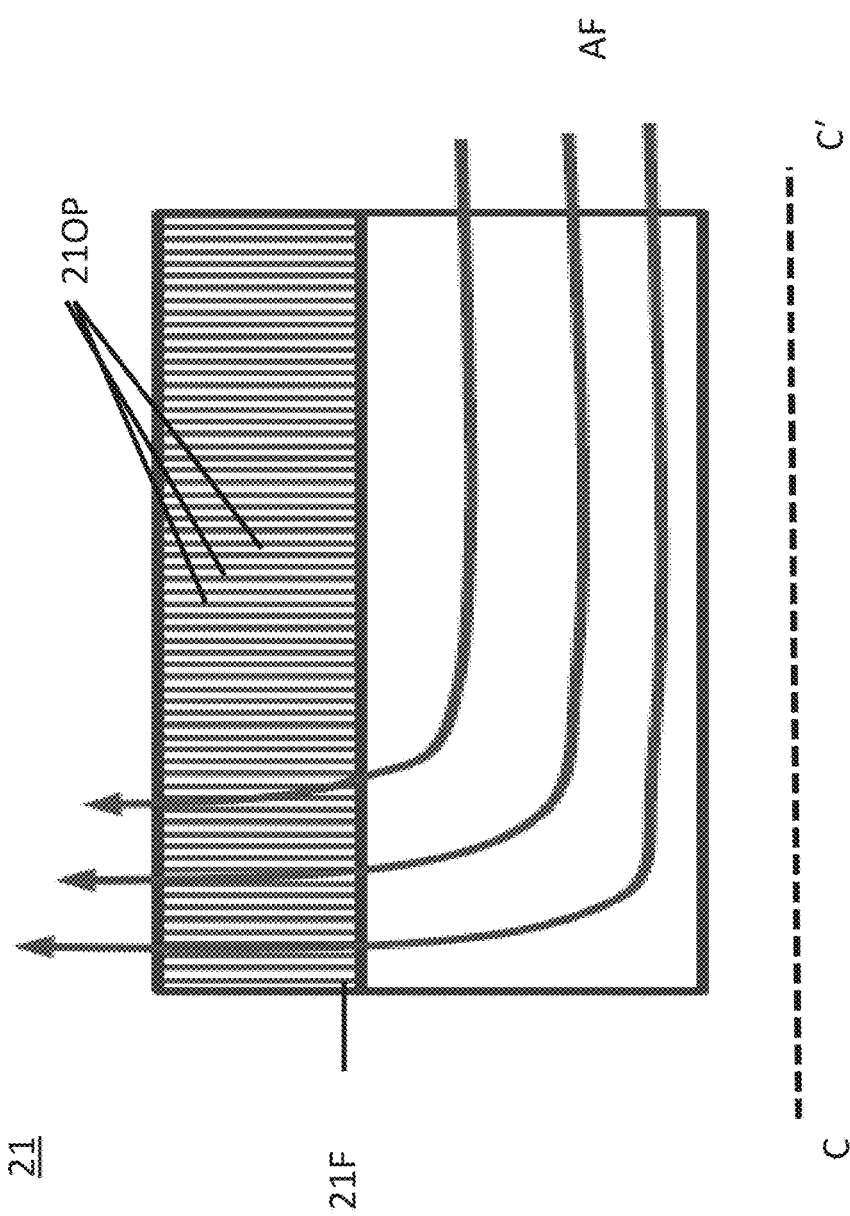
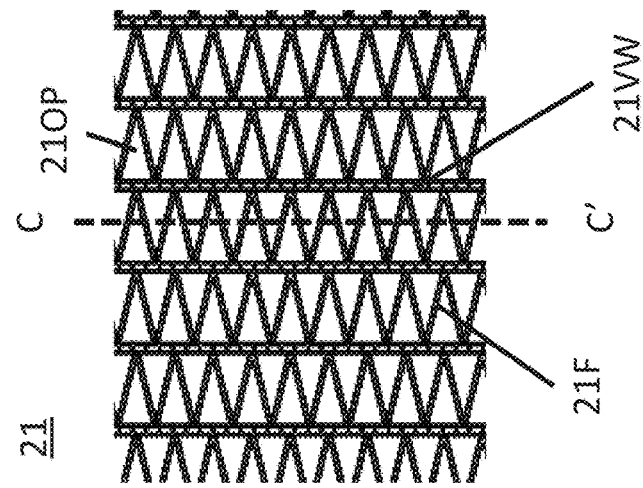

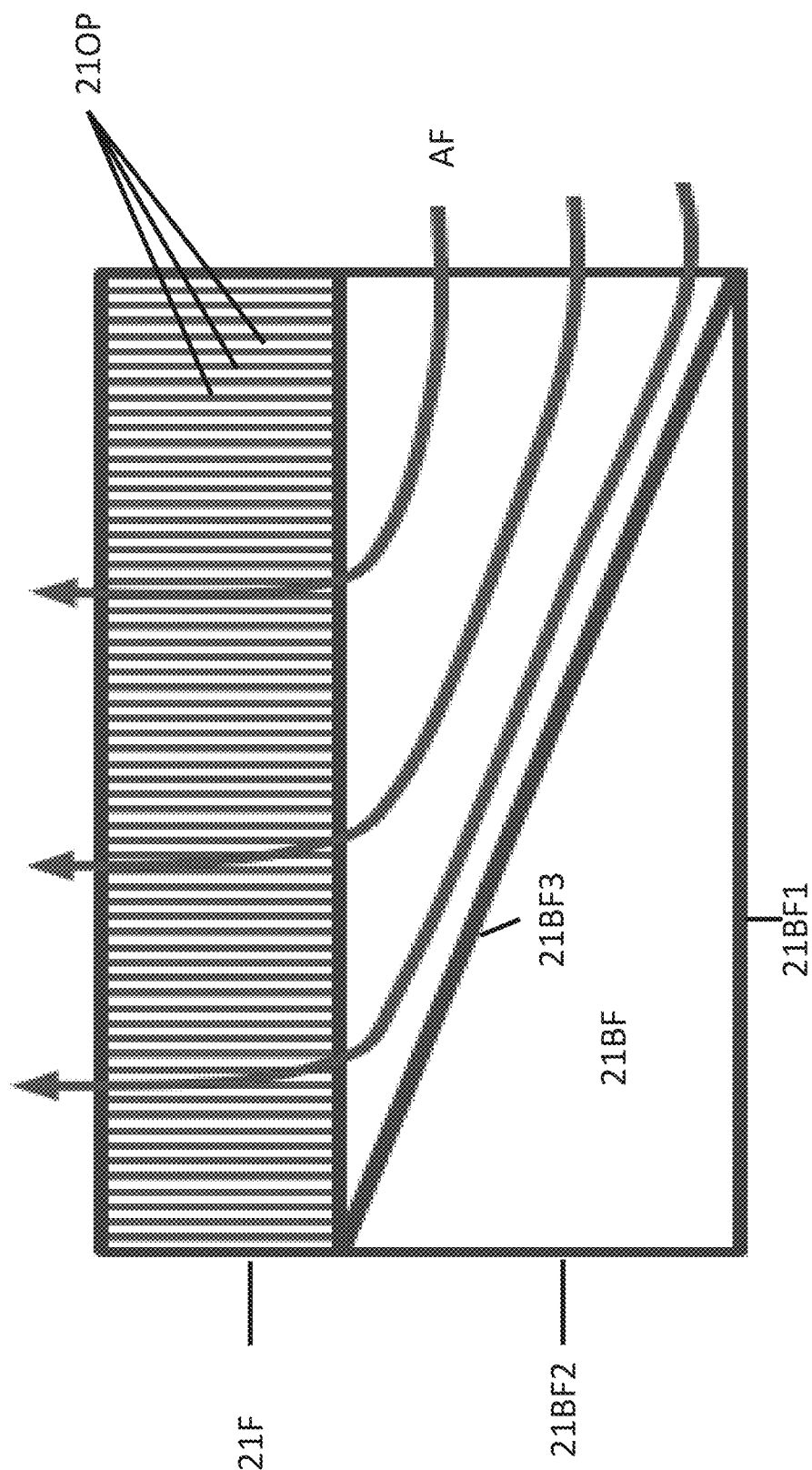

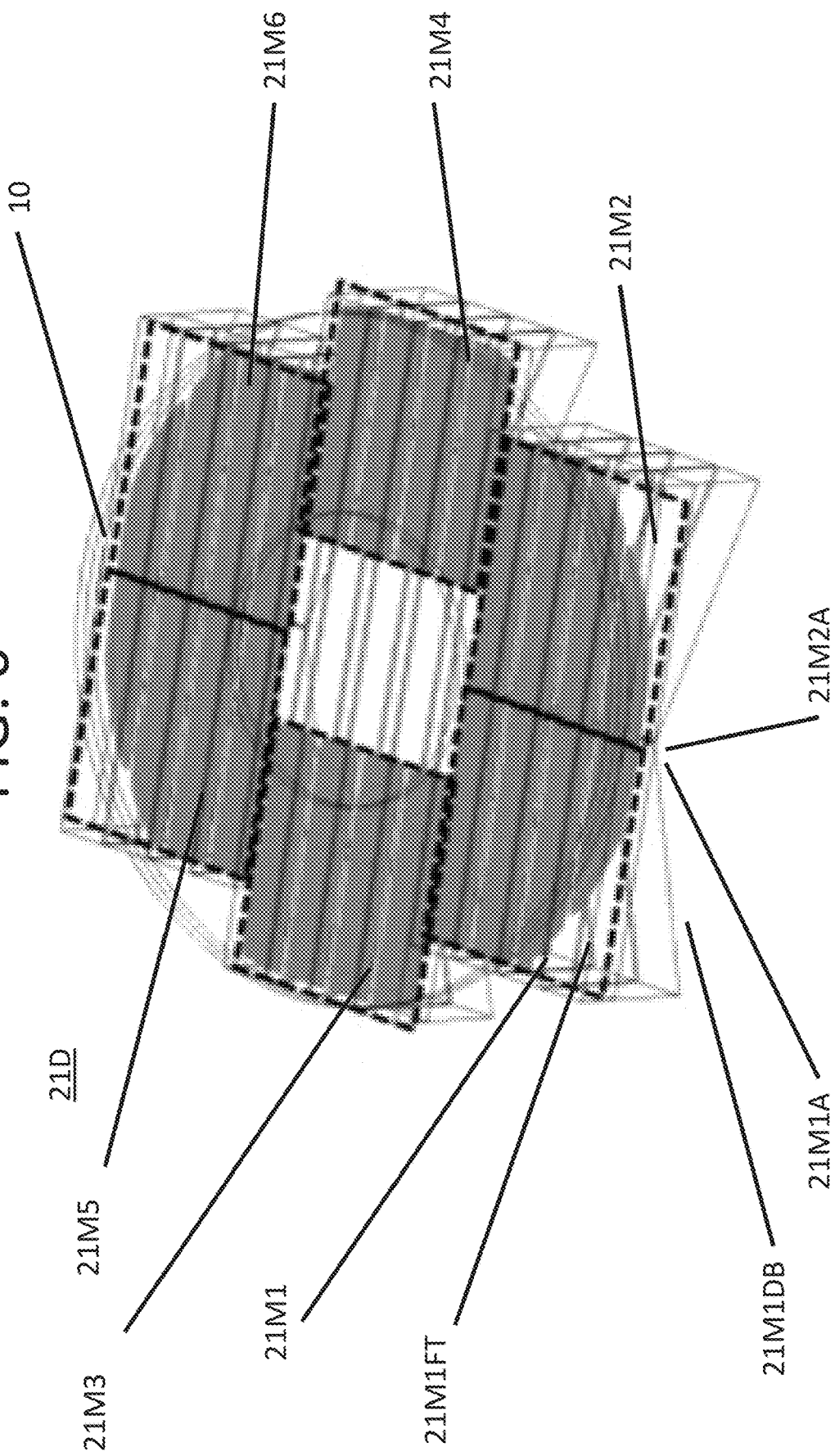

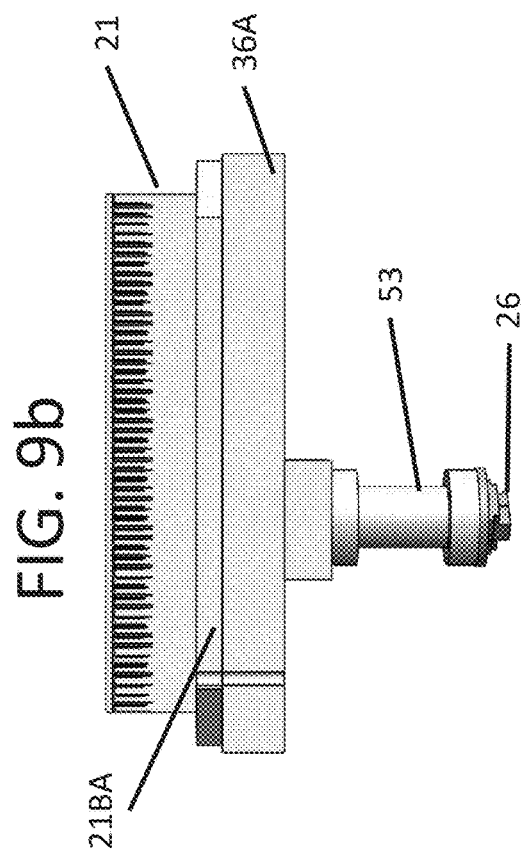
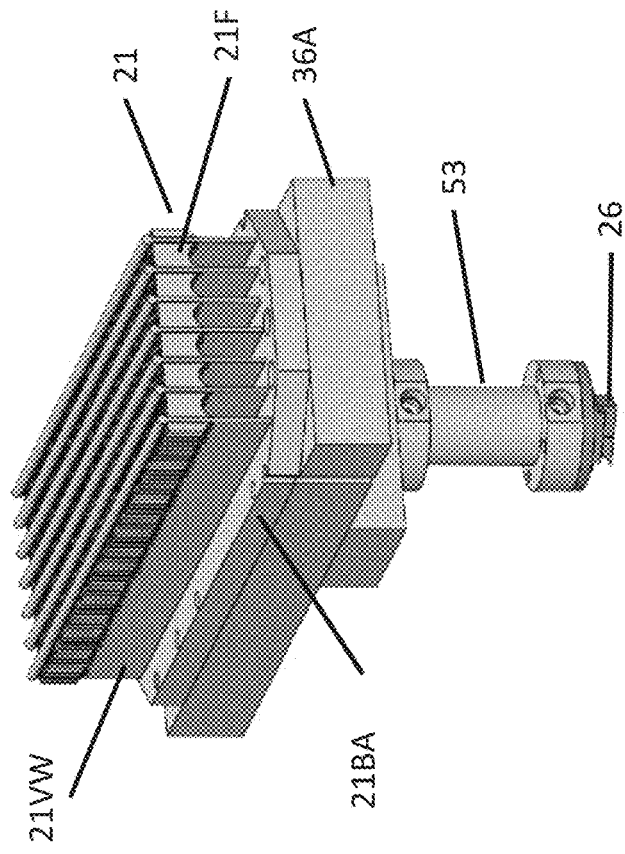

CONDENSERS AND ELECTRONIC ASSEMBLIES

CROSS-REFERENCE TO RELATED APPLICATIONS

This application claims priority under 35 U.S.C. § 119(e) to U.S. Provisional Patent Application No. 63/009,789 filed in the United States Patent and Trademark Office on Apr. 14, 2020, the entire contents of which are herein incorporated by reference.

GOVERNMENT LICENSE RIGHTS

This invention was made under CRADA 15-592 between John Deere Electronic Solutions and the National Renewable Energy Laboratory operated for the United States Department of Energy by Alliance for Sustainable Energy, LLC under Prime Contract No. DE-AC36-08GO28308. This invention was made with government support under Prime Contract No. DE-AC36-08GO28308 (CRADA 15-592) awarded by United States Department of Energy by Alliance for Sustainable Energy, LLC. The Government has certain rights in this invention.

BACKGROUND

Example embodiments relate, in general, to condensers for use in electronic assemblies.

In a power electronics system, heat generating components may include power semiconductor devices such as silicon insulated-gate bipolar transistors (IGBTs) or silicon carbide (SiC) metal-oxide-semiconductor field effect transistors (MOSFETs). The thermal design of power electronic systems regulates a junction temperature of the power semiconductor device to achieve a desired longevity and/or reliability. There may generally be two alternate cooling approaches: (1) air-cooled configurations and (2) liquid-cooled configurations.

SUMMARY

Because of high heat-flux generated by power semiconductor devices, liquid cooling is often used in an electronics system (e.g., an inverter) for heavy-duty vehicles. However, liquid-cooled configurations may be costly and/or complex due to an external pump and radiator systems that extract heat from liquid flowing through coolant channels in the electronics system.

The inventors have discovered an electronic assembly with phase-change cooling of a semiconductor device having a condenser capable of improving efficiency of the cooling.

Some example embodiments include condensers having features that may enable passive two-phase heat transfer for power-dense power electronics applications. The condenser may be used in multiple applications that having two-phase cooling of a concentrated heat source.

Some example embodiments include a condenser that enables passive, e.g. pumpless, two-phase heat transfer for power-dense power electronics.

Example embodiments include condensers that may enable removal of heat, e.g. heat produced by a semiconductor device, and may have efficient condensation of a coolant.

According to some example embodiments, there is provided a condenser for use in an electronic assembly. The condenser includes a first vertical wall extending in a vertical direction, the first vertical wall defining a first plurality of vertical condensation channels within the first vertical wall, a second vertical wall extending in the vertical direction, the second vertical wall defining a second plurality of vertical condensation channels within the second vertical wall, and a first plurality of fins extending in the vertical direction. Each of the first plurality of fins is connected to the first vertical wall, the second vertical wall or both the first vertical wall and the second vertical wall.

BRIEF DESCRIPTION OF DRAWINGS

Example embodiments will be more clearly understood from the following detailed description taken in conjunction with the accompanying drawings. FIGS. 1a-9b represent non-limiting, example embodiments as described herein.

FIG. 1a illustrates a perspective view of an electronic assembly, according to some example embodiments.

FIG. 1b illustrates a cut-out view of the electronic assembly of FIG. 1a.

FIG. 2b illustrates a cut-out and zoom-in of region "A" of the condenser of FIG. 2a.

FIG. 2c illustrates a zoom-in of region "B" of the condenser of FIG. 2b.

FIG. 4a illustrates a perspective view of an electronic assembly including a condenser, a collection manifold, and an evaporator stack, according to some example embodiments.

FIG. 4b illustrates a schematic view of a connection tube and vertical channels of FIG. 4a.

FIGS. 5a and 5b illustrate top-down and front views of a condenser, according to some example embodiments.

FIG. 5c illustrates a front view of a condenser, according to some example embodiments.

FIG. 6 illustrates a condenser, according to some example embodiments.

FIG. 7 illustrates a perspective view of an electronic assembly, according to some example embodiments.

FIG. 8 illustrates a cut-away view of an electronic assembly, according to some example embodiments.

FIG. 9a illustrates a perspective view of a condenser, a collection manifold, a connection, and an evaporator stack, according to some example embodiments.

FIG. 9b illustrates a side view of the condenser, the collection manifold, the connection, and the evaporator stack of FIG. 9a, according to some example embodiments.

DETAILED DESCRIPTION OF EXAMPLE EMBODIMENTS

Figure 2A:
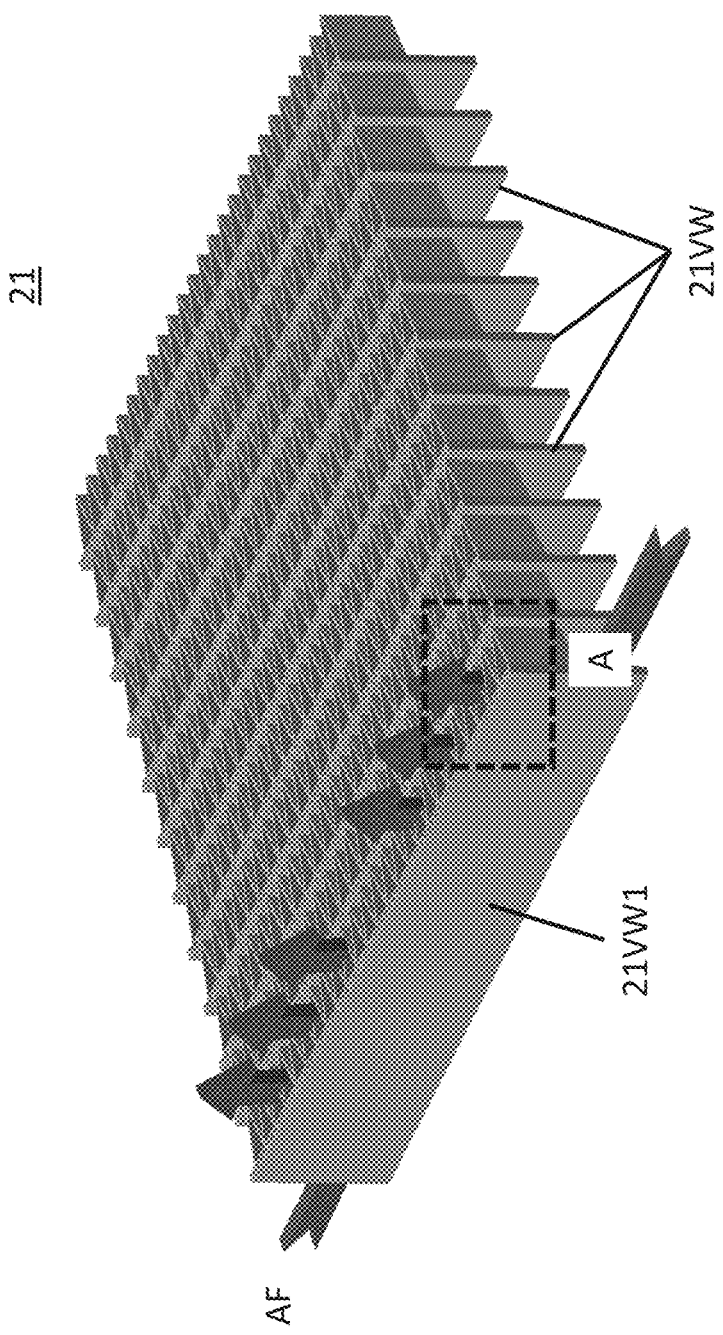
FIG. 2a illustrates a perspective view of a condenser, according to some example embodiments.

Some example embodiments will now be described more fully with reference to the accompanying drawings in which some example embodiments are illustrated.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In a power electronics system, heat generating components include power semiconductor modules/devices, such as silicon insulated gate bipolar transistors (IGBTs) and/or silicon carbide (SiC) MOSFETs, and/or gallium nitride (Ga) power semiconductor devices. A regulated junction temperature of the power semiconductor chips/modules may be beneficial to achieve a desired lifetime and/or reliability goals, particularly in high-power-density inverters used for applications such as off-highway heavy-duty vehicles. Due to high heat-flux generated by power semiconductor modules in these applications, liquid cooling may be used in the inverters for heavy-duty vehicles.

Inverter systems may be liquid cooled using a coolant/refrigerant such as water-ethylene-glycol solutions, e.g. antifreeze. Such cooling may enable efficient operation of high-powered inverter systems. Liquid cooling may use an external pump and/or radiator systems to extract heat from liquid flowing through coolant channels in a power inverter.

According to some example embodiments, liquid cooling may be enabled with a passive, pumpless air cooling, that may achieve high heat transfer from heat generated during operation of a semiconductor module/device. For example, refrigerant on a surface of the semiconductor device may vaporize and change the phase of a refrigerant (e.g. an antifreeze), which may then rise to a condenser, where heat is dissipated in air, e.g. by a fan. Upon condensation of the vapor, the refrigerant changes phase back to liquid, and collects again to be evaporated by the evaporator.

Accordingly, solutions using a 2-phase cooling media using environmentally friendly coolant/refrigerant (for example, R-245fa and HFO-1233zd) may be utilized. However, example embodiments are not limited thereto. A coolant may be or include a refrigerant with an engineered boiling point.

According to some example embodiments, there is provided a condenser comprising a first vertical wall extending in a vertical direction, the first vertical wall defining a first plurality of vertical condensation channels within the first vertical wall, a second vertical wall extending in the vertical direction, the second vertical wall defining a second plurality of vertical condensation channels within the second vertical wall, and a first plurality of fins extending in the vertical direction, each of the first plurality of fins connected to the first vertical wall, the second vertical wall or both the first vertical wall and the second vertical wall.

According to some example embodiments, the first plurality of vertical condensation channels are configured to enable condensation of a coolant, the second plurality of vertical condensation channels are configured to enable condensation of the coolant, and adjacent ones of the first plurality of fins create an airflow opening with surfaces of the first vertical wall and surfaces of the second vertical wall, the airflow opening configured to enable airflow along the vertical direction.

According to some example embodiments, a height of the first vertical wall is greater than a height of at least one of the first plurality of fins.

According to some example embodiments, adjacent ones of the first plurality of fins do not extend in a parallel horizontal direction.

According to some example embodiments, adjacent fins of the first plurality of extend in a parallel horizontal direction.

According to some example embodiments, a first one of the first plurality of fins connects to the first vertical wall and to the second vertical wall.

According to some example embodiments, a first one of the first plurality of fins contacts the first vertical wall and does not connect to the second vertical wall, a second one of the first plurality of fins contacts the second vertical wall and does not contacts the first vertical wall, and the first one of the first plurality of fins contacts the second one of the first plurality of fins.

According to some example embodiments, the condenser further includes a third vertical wall extending in the vertical direction, the third vertical wall having a third plurality of vertical condensation channels, and a second plurality of fins extending in the vertical direction, each of the second plurality of fins connected to the second vertical wall and to the third vertical wall.

According to some example embodiments, the first vertical wall includes a connection tube extending in a horizontal direction, the connection tube defining a hollow horizontal channel, the hollow horizontal channel enabling fluid communication between a first one of the first plurality of vertical condensation channels and a second one of the first plurality of vertical condensation channels.

According to some example embodiments, the first vertical wall, the second vertical wall, and the first plurality of fins are integral.

According to some example embodiments, the condenser includes a baffle connected to a bottom of the first vertical wall, the baffle having a surface that extends in a diagonal direction, the diagonal direction being diagonal with respect to the vertical direction.

According to some example embodiments, there is provided an electronic assembly comprising at least one semiconductor device on a printed circuit board, the at least one semiconductor device generating heat during operation of the at least one semiconductor device, at least one evaporator on the at least one semiconductor device, the at least one evaporator configured to evaporate a coolant based on the heat generated during the operation of the at least one semiconductor device, a collection manifold on the at least one evaporator, a condenser on the collection manifold, the condenser including a first vertical wall defining first vertical condensation channels, a second vertical wall defining second condensation channels, a first fin connecting the first vertical wall to the second vertical wall, and a second fin connecting the first vertical wall to the second vertical wall, the first fin, the second fin, the first vertical wall, and the second vertical wall defining an airflow opening, and at least one fan above the condenser, the at least one fan configured to generate airflow that flows horizontally over the at least one evaporator and vertically within the airflow opening.

According to some example embodiments, the condenser is configured to condense the coolant in the first vertical condensation channels and in the second vertical condensation channels.

According to some example embodiments, wherein a ratio of a number of evaporator stacks to a number of fans is greater than or equal to three to one.

According to some example embodiments, the condenser includes a plurality of condenser modules, and each of the plurality of condenser modules have a flat top surface and a diagonal bottom surface, the flat top surface meeting the diagonal bottom surface at an apex.

According to some example embodiments, an apex of a first condenser module of the plurality of condensers modules meets an apex of a second condenser module of the plurality of condenser modules.

According to some example embodiments, there is provided a condenser including a plurality of vertical walls, each of the plurality of vertical walls defining vertical condensation channels, each of the vertical condensation channels configured to convert a phase of a coolant to a liquid-phase, and a collection manifold at a bottom of the condenser, the collection manifold configured to collect the liquid-phase of the coolant and to provide the liquid-phase of the coolant to an evaporator.

According to some example embodiments, the collection manifold has at least four sides, and wherein each of the at least four sides are sloped to drain the liquid-phase of the coolant to the evaporator.

According to some example embodiments, an angle of inclination of each of the at least four sides is based on a target inclination of the electronic assembly.

According to some example embodiments, the condenser is integrated with the collection manifold.

FIG. 1a illustrates a perspective view of an electronic assembly, according to some example embodiments. FIG. 1b illustrates a cut-out view of the electronic assembly of FIG. 1a.

Referring to FIG. 1a, an electronic assembly 111 may be or correspond to or include an electronic assembly with phase-change cooling of at least one semiconductor device and/or other heat-generating component. For example, the electronic assembly 111 may include some or all of the components of electronic assemblies described with reference to U.S. Pat. No. 10,278,305, the entire contents of which are herein incorporated by reference, with differences explained herein.

The electronic assembly 111 may include at least one fan 10. The fan 10 may be arranged in a fan section 101 of the electronic assembly 111. The fan 10 may be arranged horizontally on an upper portion of the electronic assembly 111.

The fan 10 may include a plurality of blades (not shown). The fan 10 may rotate the blades in a clockwise, or alternatively, counter-clockwise manner. Different ones of a plurality of fans 10 may rotate blades in the same, or in different, directions. Rotation of blades of the fan 10 may induce airflow, to be described in more detail below.

The fan section 101 may be positioned over a condenser section 121. The condenser section 121 may include at least one condenser (shown in FIG. 2a), to be described in more detail below. The condenser section 121 may be positioned above other components of the electronic assembly 111.

For example, the electronic assembly 111 may include an evaporator stack 26. The evaporator stack 26 may include at least one evaporator stack such as those described with reference to U.S. Provisional Patent Application No. 63/009,789.

Figure 2D:
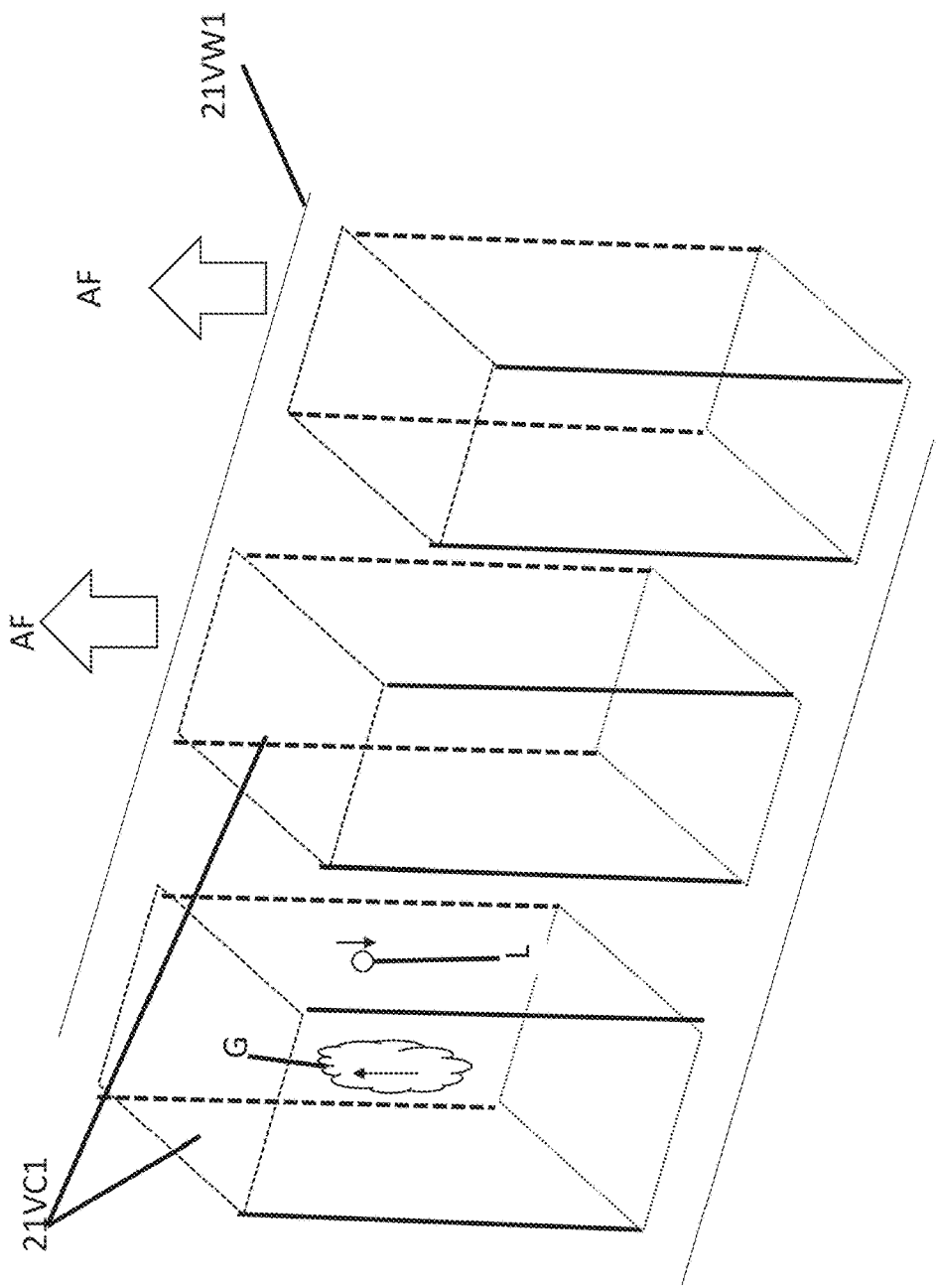
FIG. 2d illustrates a schematic view of a vertical condensation channel of FIGS. 2a-2c.

FIG. 2a is a perspective view of a condenser 21, FIG. 2b is a cut-out and zoom-in of region "A" of the condenser 21, FIG. 2c is a zoom-in of region "B" in FIG. 2b, according to some example embodiments, and FIG. 2d is a schematic view of a vertical condensation channel, according to some example embodiments.

Referring to FIGS. 2a-2d, the condenser 21 may be formed of a material, such as a metal and/or an alloy, having thermal properties that enable condensation of a coolant. For example, the condenser 21 may be formed of at least one of aluminum, copper-nickel alloys, brass, titanium, stainless steel, and/or ferritic stainless steel; however, example embodiments are not limited thereto.

The condenser 21 may be formed in an integrated manner. For example, the condenser manifold 21 may be formed from a 3D printing process and/or from a die-cast molding process; however, example embodiments are not limited thereto.

The condenser 21 may include a plurality of vertical walls 21VW including a first vertical wall 21VW1 and a second vertical wall 26VW2, along with a plurality of fins such as the plurality of fins 21F1.

Each of the plurality of vertical walls 21VW may extend in a horizontal direction. The horizontal direction may be relative to a bottom surface of the electronic assembly 111. Each of the plurality of vertical walls 21VW may extend parallel to one another. For example, each of the vertical walls 21VW may extend in a first horizontal direction. The first horizontal direction may correspond to one of the longitudinal directions of the electronic assembly 111 described above with regards to FIG. 1*a*.

FIG. 2*b* illustrates a cut-out and zoom-in of the condenser 21 of FIG. 2*a*. FIG. 2*b* is cut out in a direction parallel to the first and second horizontal directions.

Referring to FIG. 2*b*, within each of the plurality of vertical walls 21VW, there may be a plurality of vertical condensation channels. For example, within the first vertical wall 21VW1 there may be a plurality of first vertical condensation channels 21VC1. Similarly within the second vertical wall 21VW2 there may be a plurality of second vertical condensation channels 21VC2. For example, there may be about 60 to about 110, e.g. about 85, first vertical condensation channels 21VC1 in the first vertical wall 21VW1, and there may be the same, or a similar number, of second vertical condensation channels 21VC2 in the second vertical wall 21VW2. A number of vertical channels VC1 and a number of vertical channels VC2 may be determined based on dimensions of the condenser 21.

Each of the vertical condensation channels such as the vertical condensation channels 21VC1 and 21VC2 may extend in a vertical direction. The vertical direction may be perpendicular to the first and/or second horizontal direction.

Each of the vertical condensation channels such as the vertical condensation channels 21VC1 and 21VC2 may extend a significant portion, or the entire portion, of the height of the respective vertical walls 21VW1 and 21VW2. Each of the vertical condensation channels such as the vertical condensation channels 21VC1 and 21VC2 may be hollow, e.g. may form a channel and/or a chamber. Each of the vertical condensation channels such as the vertical condensation channels 21VC1 and 21VC2 may have an opening at a top of the respective vertical walls 21VW1 and 21VW2, and may have an opening at a bottom of the respective vertical walls 21VW1 and 21VW2. Dimensions, such as heights of the vertical walls 21VW1 and 21VW2, will be described in more detail with reference to FIGS. 3*a*-3*c*.

Referring to FIG. 2*c*, a length l of the opening of the vertical condensation channels 21VC1 and 21VC2 may be about 3 mm, and a width w of the opening of the vertical condensation channels 21VC1 and 21VC2 may be about 1.5 mm, respectively; however, example embodiments are not limited thereto. A thickness t of the portion of the vertical walls that separate adjacent vertical condensation channels 21VC1 and 21VC2 may be about 0.75 nm; however, example embodiments are not limited thereto. Furthermore, each of the vertical condensation channels within the vertical condensation channels 21VC1 may have the same, or different, dimensions, e.g. the same and/or different lengths l, the same and/or different widths w, and the same and/or different thickness t. Similarly, each of the vertical condensation channels within the vertical condensation channels 21VC2 may have the same, or different, dimensions, e.g. the same and/or different lengths l, the same and/or different widths w, and the same and/or different thickness t.

The vertical condensation channels 21VC1 and 21VC2 are illustrated in FIGS. 2*a*-2*d* as having rectangular cross-section; however, example embodiments are not limited thereto. For example, the vertical condensation channels 21VC1 and 21VC2 may have the same, or different, shapes. Furthermore the vertical condensation channels 21VC1 and 21VC2 may have rectangular openings, or square shapes, or elliptical shapes, or any similar shape. The vertical condensation channels 21VC1 and 21VC2 may have openings having various shapes, based on, for example, ease of manufacturing.

Each of the vertical condensation channels such as the vertical condensation channels 21VC1 and 21VC2 may be defined by the walls in which they are formed. For example, the vertical condensation channels 21VC1 may be or correspond to hollow channels within the vertical wall 21VW1, and similarly the vertical condensation channel 21VC2 may be or correspond to hollow channels within the vertical wall 21VW2.

As will be explained in more detail below, each of the vertical condensation channels such as the vertical condensation channels 21VC1 and 21VC2 may receive a gas-phase, e.g. a vapor, of a coolant and/or refrigerant. The vertical condensation channels 21VC1 and 21VC2 may cause condensation of the gas-phase of the coolant, e.g. may cause the coolant to convert to a liquid-phase. For example, there may be nucleation and/or condensation within the sidewalls of the vertical condensation channels 21VC1 and 21VC2. The coolant may convert to liquid-phase, and may fall down the vertical condensation channels 21VC1 and 21VC2, e.g. may fall down sidewalls of the vertical condensation channels 21VC1 to 21VC2.

Still referring to FIGS. 2*a*-2*c*, the condenser 21 may include a plurality of fins, such as a plurality of first fins 21F1. The plurality of fins 21F1 may be connected, e.g. directly connected, to the first vertical wall 21VW1 and the second vertical wall 21VW2.

Adjacent ones of the plurality of fins may extend in horizontal directions that are not parallel, and may, for example, correspond to walls of corrugated cardboard. However, example embodiments are not limited thereto. Adjacent ones of the plurality of fins may extend in a parallel horizontal direction; however, example embodiments are not limited thereto.

Adjacent ones of the plurality of fins, such as adjacent ones of the first plurality of fins 21F1, in conjunction with vertical walls, such as vertical wall 21VW1 and/or vertical wall 21VW2, may define at least one vertical opening 210P. The vertical opening 210P may enable airflow to pass through, e.g. to pass through in a vertical manner. As shown in FIG. 2*b*, the plurality of fins 21F1, the vertical wall 21VW1 and the vertical wall 21VW2 define a plurality of vertical openings 210P in which the cross-section of the opening is triangular. However, example embodiments are not limited thereto.

Referring back to FIG. 2*a*, there may be airflow AF that is produced by the fan 10, for example. The airflow AF may initially flow transverse to and on lower portions of the electronic assembly 111, e.g. may flow horizontally below the condenser 21. The airflow AF may then flow vertically, e.g. air may be pulled vertically, within vertical openings of the condenser, such as within the vertical opening 210P. For example, the airflow AF may flow in the direction illustrated in FIG. 2a.

FIG. 2d illustrates a schematic view a process of coolant evaporation within the vertical condensation channel 21VC1, according to some example embodiments.

Referring to FIG. 2d, there may be airflow AF generated by a fan, such as fan 10 illustrated in FIG. 1a. The airflow AF may rise vertically between openings, such as openings 210P illustrated in FIG. 2b.

A coolant may be in a gas-phase G within the vertical channel 21VC1. The gas-phase of the coolant may be lighter than air, and the coolant may rise in the vertical direction.

The coolant may cool, e.g. may cool because of the airflow AF, and may nucleate and condense to the liquid-phase L. The coolant may condense within any of the surfaces of the vertical wall 21VW1.

The liquid-phase L of the coolant may fall vertically, e.g. may fall in the vertical direction. The liquid-phase L may fall down, e.g. may fall down by gravity.

Figure 3B:
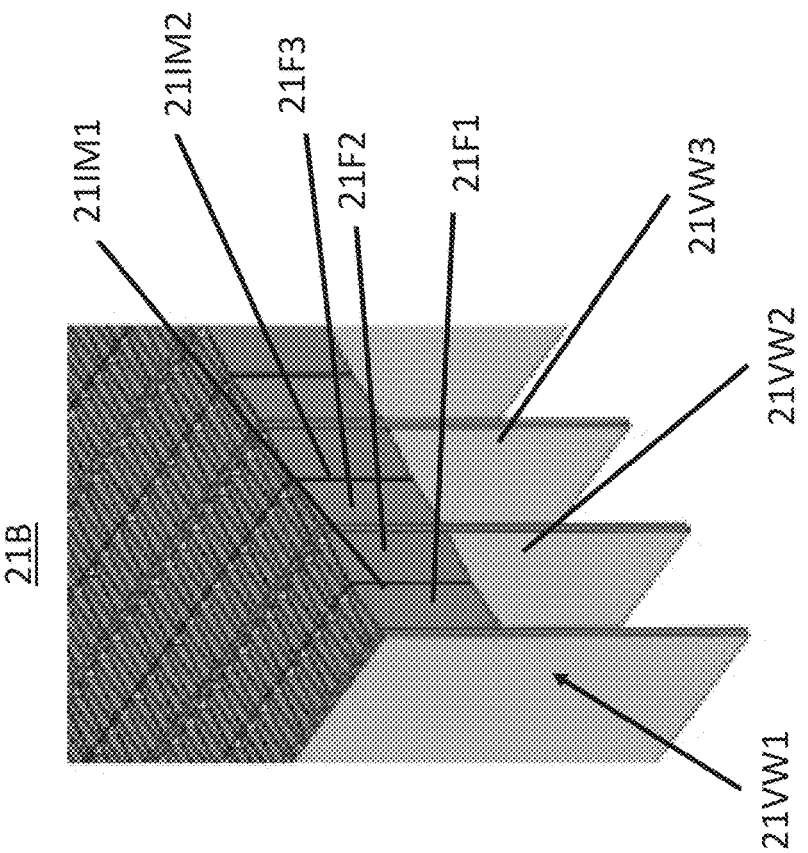
FIG. 3b illustrates a perspective view of a condenser, according to some example embodiments.
Figure 3A:
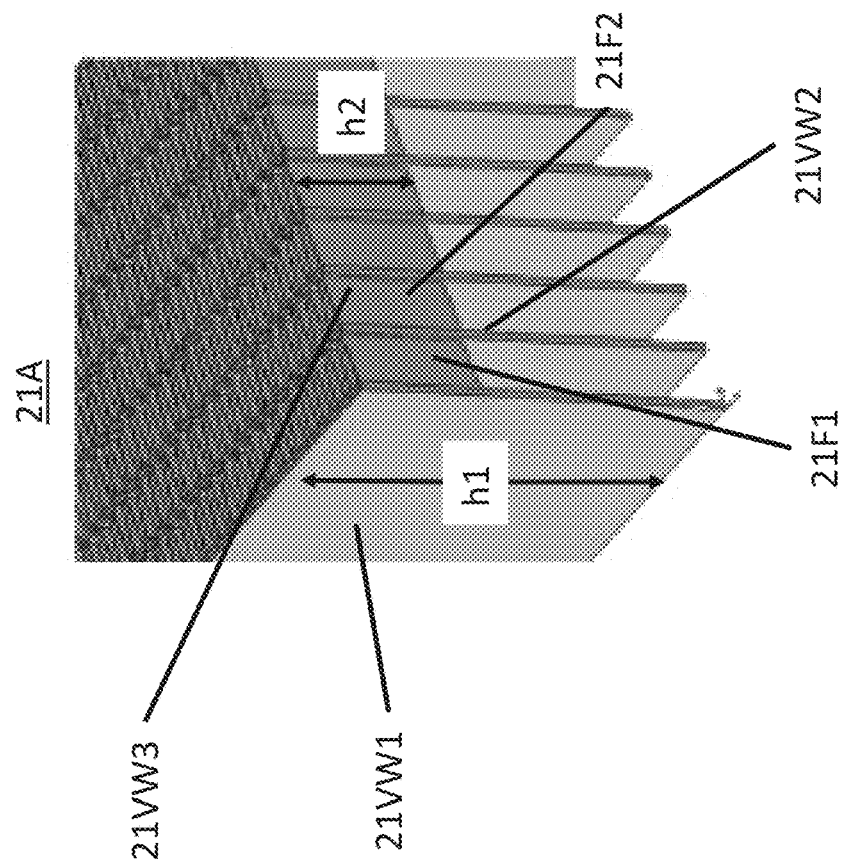
FIG. 3a illustrates a perspective view of a condenser, according to some example embodiments.

FIG. 3a illustrates a condenser 21A according to some example embodiments.

Descriptions of features similar between the condenser 21 of FIGS. 2a-2d and the condenser 21A of FIG. 3a may be omitted for brevity.

Referring to FIG. 3a, the first vertical wall 21VW1 may have a height h1, while the first plurality of fins 21F1 may have another height h2. Other vertical walls such as vertical wall 21VW2 may have heights the same or similar to those of the first vertical wall 21VW1. Other fins such as 21F2 may have heights the same or similar to those of the first plurality of fins 21F1.

The height h1 may be greater than the height h2. For example, the height h1 may be about 45 mm, while the height h2 be about 15 mm.

Each of the first plurality of fins 21F1 may be connected to an upper portion of the first vertical wall 21VW1 and the second vertical wall 21VW2, and similarly each of the second plurality of fins 21F2 may be connected to an upper portion of the first vertical wall 21VW1 and the second vertical wall 21VW2. Tops of each of the first plurality of fins 21F1 and tops of the second plurality of fins 21F2 may be flush with one another, and may also be flush with tops of the second plurality of fins 21F2.

Each of the first plurality of fins 21F1 may be connected to both the first vertical wall 21VW1 and the second vertical wall 21VW2. Each of the second plurality of fins 21F2 may be connected to the second vertical wall 21VW2, but not connected to the first vertical wall 21VW1. Instead, each of the second plurality of fins 21F2 may be also connected to a third vertical wall 21VW3.

A number of vertical walls 21VW included in the condenser 21A may be about 8 to about 30, e.g. may be about 24; however, example embodiments are not limited thereto. The number of vertical walls 21VW included in the condenser 21A may be determined, e.g. determined by airflow and/or heat transfer requirements.

FIG. 3b illustrates a condenser 21B according to some example embodiments.

Referring to FIG. 3b, each of the first plurality of fins 21F1 may be connected to the first vertical wall 21VW1, but may not be connected to the second vertical wall 21VW2. Each of the first plurality of fins 21F1 may be connected to a first intermediate connection 21IM1. Each of the second plurality of fins 21F2 may be connected to the second vertical wall 21VW2, but may not be connected to the third vertical wall 21VW3. Each of the second plurality of fins 21F2 may be connected to the first intermediate connection 21IM1. A third plurality of fins 21F3 may be connected to the second vertical wall 21VW2 and to a second intermediate connection 21IM2. Each of the first intermediate connection 21IM1 and the second intermediate connection 21IM2 may extend in the same direction as the first vertical wall 21VW1 and the second vertical wall 21VW2. Each of the first intermediate connection 21IM1 and the second intermediate connection 21IM2 may not include any vertical condensation channels.

A number of vertical walls 21VW included in the condenser 21B may be about 4 to about 20, e.g. may be about 12; however, example embodiments are not limited thereto. The number of vertical walls 21VW included in the condenser 21B may be determined, e.g. determined by airflow and/or heat transfer requirements.

FIG. 4a illustrates a perspective view of an electronic assembly 111 including a condenser 21, a collection manifold 36, and an evaporator stack 26, according to some example embodiments. FIG. 4b illustrates a schematic view of fluid communication between vertical condensation channels and connection tubes, according to some example embodiments.

Referring to FIG. 4a, the condenser 21 may correspond to a condenser, such as those described above with reference to FIGS. 1a-3b, and/or below with reference to FIGS. 5a-10.

There may be airflow AF, for example airflow AF generated by a fan (not shown). The airflow AF may initially flow horizontally over the electronic assembly 11, and then vertically, e.g. vertically between separate vertical walls 21VW.

The condenser 21 may include at least one connection tube 21CT. There may be a connection tube over each of the plurality of vertical walls 21VW. Connection tubes such as the connection tube 21CT may extend in a horizontal direction along the length of a corresponding vertical wall. For example, the connection tube 21CT may extend over the first vertical wall 21VW1. The connection tube 21CT may be hollow, e.g. may form a hollow horizontal channel. In example embodiments and shown in FIG. 4a, connection tubes extend over the vertical walls 21VW, respectively.

Referring to FIG. 4b, each connection tube 21CT may enable fluid communication with vertical condensation channels included in respective ones of the vertical walls 21VW. For example, the connection tube 21CT may be in communication with, e.g. in fluid communication with, the vertical condensation channels 21VC1 (described above with reference to FIG. 1b) included in the first vertical wall 21VW1.

For example, the connection tube 21CT may allow for vapor, e.g. gas-phase G, of the coolant to disperse, e.g. disperse more evenly, among each of the vertical condensation channels 21VC1. There may be condensation, e.g. conversion of the gas-phase G of the coolant to the liquid-phase L of the coolant, along the sides of the vertical condensation channels 21VC1.

Although the connection tube 21CT is illustrated as cylindrical, example embodiments are not limited thereto. A diameter of the connection tube 21CT may be about 10 mm; however, example embodiments are not limited thereto.

Still referring to FIG. 4a, the condenser 21 may include a base 21BA. The base 21BA may be at a bottom of the condenser 21.

The electronic assembly 111 includes a collection manifold 36 situated below the base 21BA of the condenser 21. There may be an opening within the base 21BA to allow fluid communication between the condenser 21 and the collection manifold 36, to be described in more detail with reference to FIGS. 9a-9g.

The collection manifold 36 may collect any liquid-phase of the coolant that has condensed within the condensation channels such as condensation channels 21VC1 and 21VC2, described above with respect to FIG. 2b. Furthermore, there may be additional condensation of the coolant within the collection manifold 36.

The collection manifold 36 and the condenser 21 may be formed in an integrated manner; however, example embodiments are not limited thereto.

There may be an evaporator stack 26 underneath the collection manifold 36. For example, there may be an evaporator stack 26 that is connected to the collection manifold 36.

The evaporator stack 26 may be situated on or directly on a semiconductor device, such as the semiconductor device 20 described below with respect to FIG. 8. The semiconductor device may generate heat during operation. The heat generated may cause evaporation of a coolant from a liquid-phase to a gas-phase. For example, the evaporator stack 26 may lead to evaporation of the coolant.

The collection manifold 36 may have sloped surfaces. The collection manifold may have at least one surface that is sloped at an angle Theta, for example sloped relative to a lower surface of the electronic assembly 111. The slope Theta may be based on specific requirements of the electronic assembly 111. The slope Theta may be a slope that enables collection of a liquid-phase of the coolant so as to drain the coolant to the evaporator stack 26.

For example, the electronic assembly 111 may be positioned horizontally, or alternatively, at an angle relative to the ground, e.g. to a floor of a building or a floor of a vehicle such as an electronic vehicle. The electronic assembly 111 may be positioned at a target inclination relative to the ground or floor.

As described in more detail with reference to FIG. 8, during operation of the electronic assembly 111, a semiconductor device/module may generate heat, and the evaporator stack 26 may cause evaporation of a liquid-phase of a coolant to a gas-phase of the coolant.

The coolant may rise, e.g. may rise vertically relative to the ground. The coolant may condense, e.g. may condense into a liquid-phase L, within the condenser 21 and/or within the collection manifold 36.

After condensation and conversion of the coolant to a liquid-phase L, and collection within the collection manifold 36, the coolant may fall down by gravity, for example down sidewalls of the collection manifold 36.

If the electronic assembly 111 is not positioned horizontally relative to the ground (e.g. relative to a floor of a building or of a vehicle), there may still be evaporation of the coolant from the evaporator stack 26, condensation of the coolant within the condenser 21, and collection of the coolant within the collection manifold 36. The slope Theta may be a slope that enables collection of the liquid-phase of the coolant, if the electronic assembly is not positioned horizontally relative to the ground.

For example, the electronic assembly 111 may be allowed to be at a slope relative to the ground of the earth, and the angle Theta may be based upon the angle relative to which the electronic assembly is situated with respect to the ground of the earth.

FIGS. 5a-5b illustrate top-down and a cross-sectional view of a condenser 21C, according to some example embodiments. FIG. 5b illustrates a side-view of the condenser 21C taken along cut-line "C-C" of FIG. 5a.

Referring to FIGS. 5a-5b, the condenser 21 may include a plurality of vertical walls such as vertical wall 21VW1, each having vertical condensation channels such as 21VC1.

There may be airflow such as airflow AF. The airflow AF may be generated, for example, by a fan 10 described above with reference to FIG. 1a. The airflow AF may rise vertically upward, for example may rise vertically upward in the vertical openings 210P described above with respect to FIG. 2b.

Referring to FIG. 5a, the airflow AF may be more pronounced on one end, e.g. the left end, of the condenser 21. There may be inefficient cooling and/or condensation of a coolant.

FIG. 5c is a side-view of a condenser 21C, according to some example embodiments. The condenser 21C may include features similar to those discussed above with respect to FIGS. 1a-5b, and descriptions thereof may be omitted for brevity.

Referring to FIG. 5c, the condenser 21C may include a baffle 21BF. There may be airflow such as airflow AF. The airflow AF may be generated, for example, by fan 10. The airflow AF may rise vertically upward, for example may rise vertically upward in the vertical openings 210P described above with respect to FIG. 2b.

For example, the baffle 21BF may cause the airflow AF to be more uniform, e.g. may not bunch at one end or another end of the condenser 21, and instead may be distributed in a more uniform manner.

The baffle 21BF may be hollow, and may be defined by at least three surfaces including horizontal surface 21BF1, vertical surface 21BF2, and diagonal surface 21BF3.

FIG. 6 illustrates a condenser 21D comprising a plurality of condenser modules according to some example embodiments.

Referring to FIG. 6, the condenser 21D may include a plurality of condenser modules such as condenser modules 21M1-21M6. For example, there may be six condenser modules included in condenser 21D.

The condenser 21D may be arranged in an electronic assembly, for example may be arranged in the condenser section 121 described above with respect to FIG. 1b. The condenser 21D may be arranged below the fan section 101 illustrated above with respect to FIG. 1b. There may be fans, such as fans 10, that provide airflow.

The condenser modules 21M1, 21M2, etc. included in the condenser 21D may include features similar to those described with reference to FIGS. 1a-10. For example, each of, or at least one of, the condenser module 21M1-21M6 may include features similar to condenser 21C described above with respect to FIG. 5b. Accordingly, similar features may be omitted for brevity.

As illustrated in FIG. 6, the condenser module 21M1 may have a flat top surface 21M1FT, and may have a diagonal bottom surface 21M1DB that extends in a diagonal direction. The flat top surface 21M1FT and the diagonal bottom surface 21M1DB may meet, for example may meet at an apex 21M1A.

Similarly, the condenser module 21M2 may have a flat top surface 21M2MFT and a diagonal bottom surface 21M2DB. The flat top surface 21M1FT and the diagonal bottom surface 21M1DB may meet, for example may meet at an apex 21M2A.

As illustrated in FIG. 6, the apex 21M1A and the apex 21M2A may be adjacent to one another.

The plurality of condenser modules 21M1-21M6 may form a pattern; for example, the plurality of condenser modules 21M1-21M6 may form a pattern as illustrated in FIG. 6. There may be a fan such as the fan 10 above the condenser 21D. The fan 10 may be roughly the same size as the condenser 21D.

Figure 7:
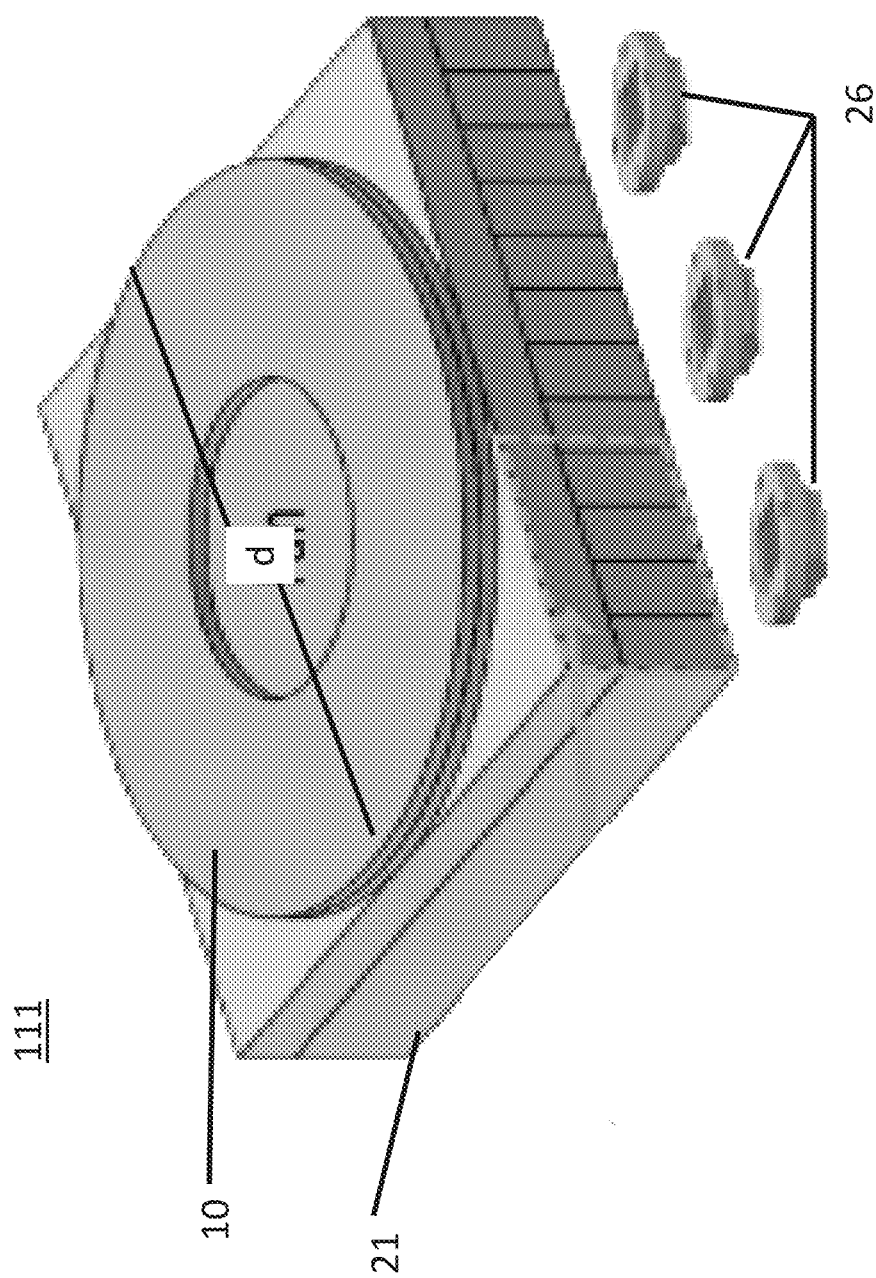

FIG. 7 illustrates an electronic assembly 111, according to some example embodiments. The electronic assembly 111 described in FIG. 7 may correspond to the electronic assembly 111 described above with respect to FIGS. 4a and 4b.

Referring to FIG. 7, an electronic assembly 111 may include a fan 10, a condenser 21, and a plurality of evaporator stacks 26. There may be at least one collection manifold (not shown) between the condenser 21 and the plurality of evaporator stacks 26.

The fan 10 may have a diameter d of about 250 mm; however, example embodiments are not limited thereto.

The condenser 21 may correspond to at least one of the condensers described above with respect to FIGS. 1-6. For example, the condenser 21 may correspond to the condenser 21D described above with respect to FIG. 6.

There may be a number of evaporator stacks 26 included in the electronic assembly 111. For example, as illustrated in FIG. 7, according to example embodiments, one fan 10 may be able to support sufficient airflow to provide condensation of a gas-phase of a coolant that has been evaporated by up to three evaporator stacks 26. A ratio of a number of fans 10 to a number of evaporator stacks 26 may be about one to three; however, example embodiments are not limited thereto.

Figure 8:
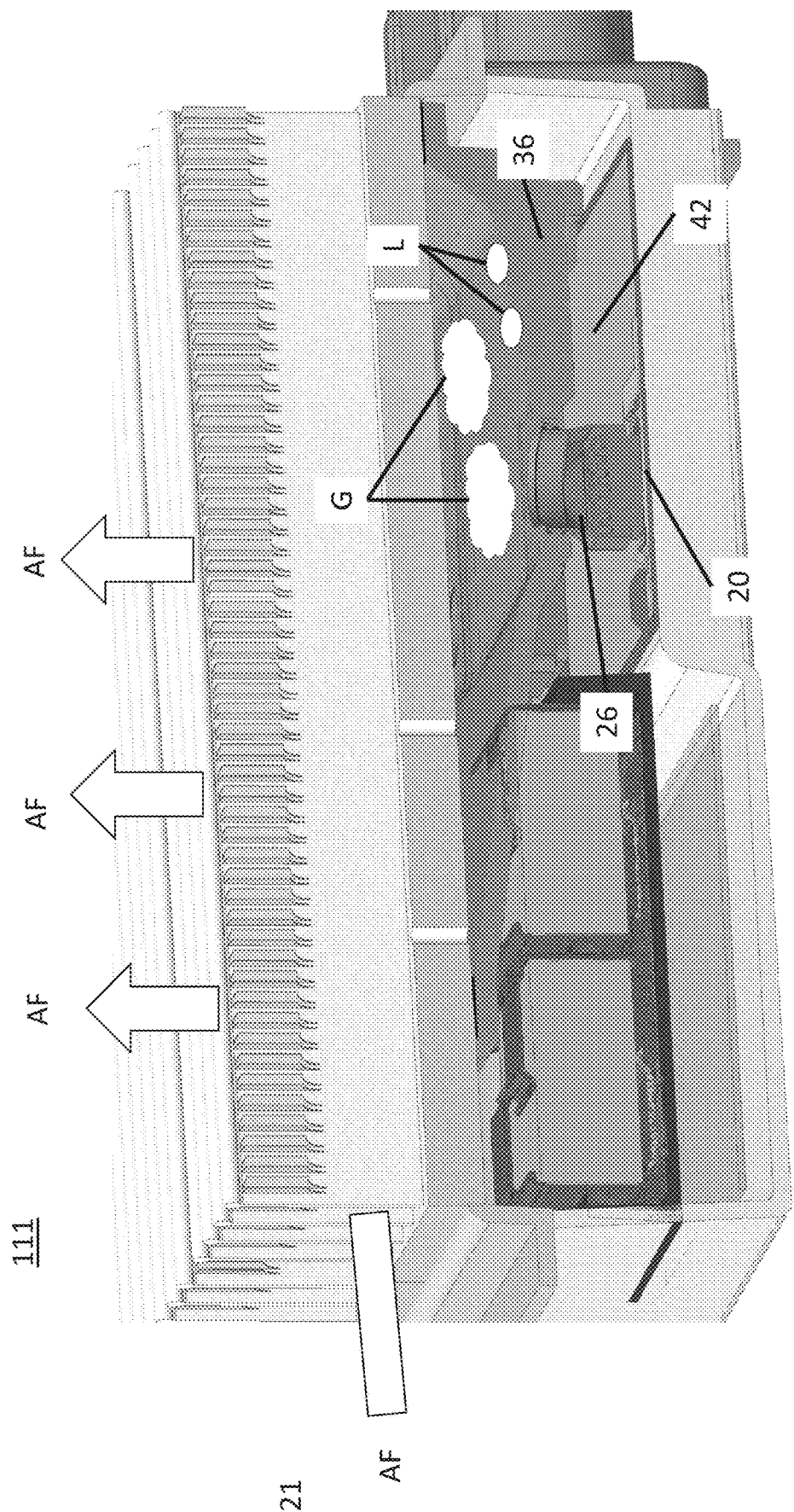

FIG. 8 illustrates a cut-away view of an electronic assembly 111, according to some example embodiments.

As illustrated in FIG. 8, an electronic assembly 111 may include a condenser 21, a collection manifold 36, a semiconductor device 20, and an evaporator stack 26.

The semiconductor device 20 may be include in a printed circuit board 42. The semiconductor device 20 may be or include a power-dense semiconductor device, such as an insulated-gate bipolar transistor (IGBT) semiconductor device. The electronic assembly 111 may be or correspond to an inverter, for example an inverter for use in an electronic vehicle.

The semiconductor device 20 may generate heat, for example, may generate heat during operation. The heat generated by the semiconductor device 20 may rise through the evaporator stack 26. The evaporator stack 26 may cause evaporation (e.g. boiling) of a coolant, for example may cause a coolant to change from a liquid-phase L to a gas-phase G The gas-phase G of the coolant may rise through the collection manifold 36. The coolant may cool and condense to the liquid-phase L within the collection manifold 36. The gas-phase G of the coolant may further rise into the condenser 21. For example, the gas-phase G of the coolant may rise through openings on the bottom of the condenser 21, to be described in more detail with reference to FIG. 9b.

When the gas-phase G of the coolant enters the condenser 21, the gas-phase G may cool. For example, the gas-phase G may cool from airflow AF provided by fans.

The gas-phase G of the coolant may condense within vertical condensation channels of the condenser 21, for example may rise through the vertical condensation channels 21VC1 and 21VC2 described above with reference to FIG. 2b.

The gas-phase G of the coolant in the condenser 21 may be cooled, for example may be cooled by airflow produced by a fan (not shown), such as the airflow AF generated by the fan 10 described above with reference to FIGS. 1a-7. Upon cooling, the coolant may condense, for example may condense in the condenser 21 and/or in the collection manifold 36.

Upon condensing into the liquid-phase L, the coolant may fall back through the collection manifold 36, and may be resupplied to a surface of, e.g. a top surface of, the semiconductor chip 20, through the evaporator stack 26.

Accordingly, there may be a passive two-phase cooling of the electronic assembly 111.

Figure 9D:
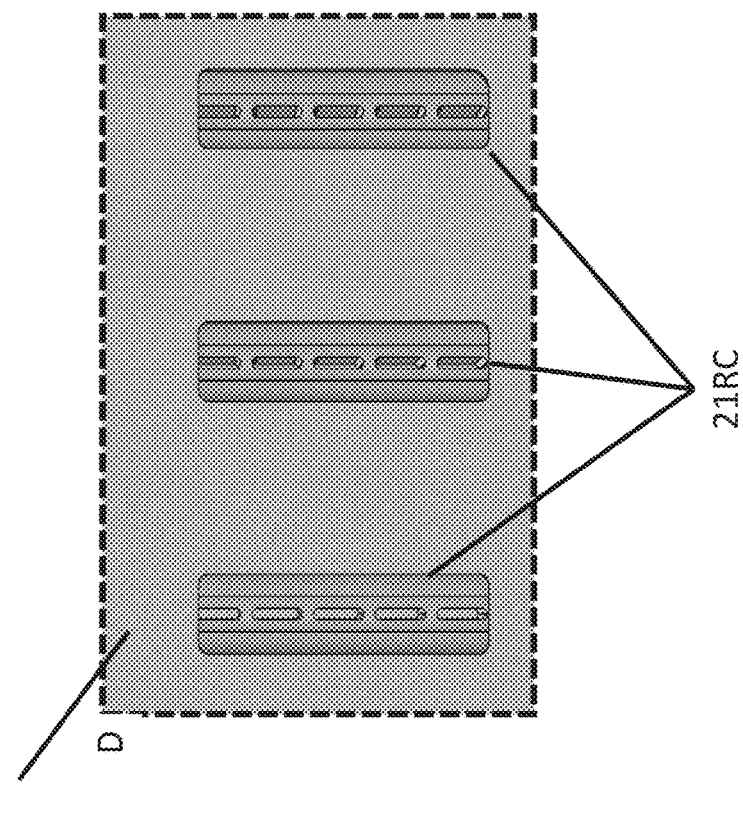
FIG. 9d illustrates a zoom-in of the region labelled "D" of FIG. 9c, according to some example embodiments.
Figure 9C:
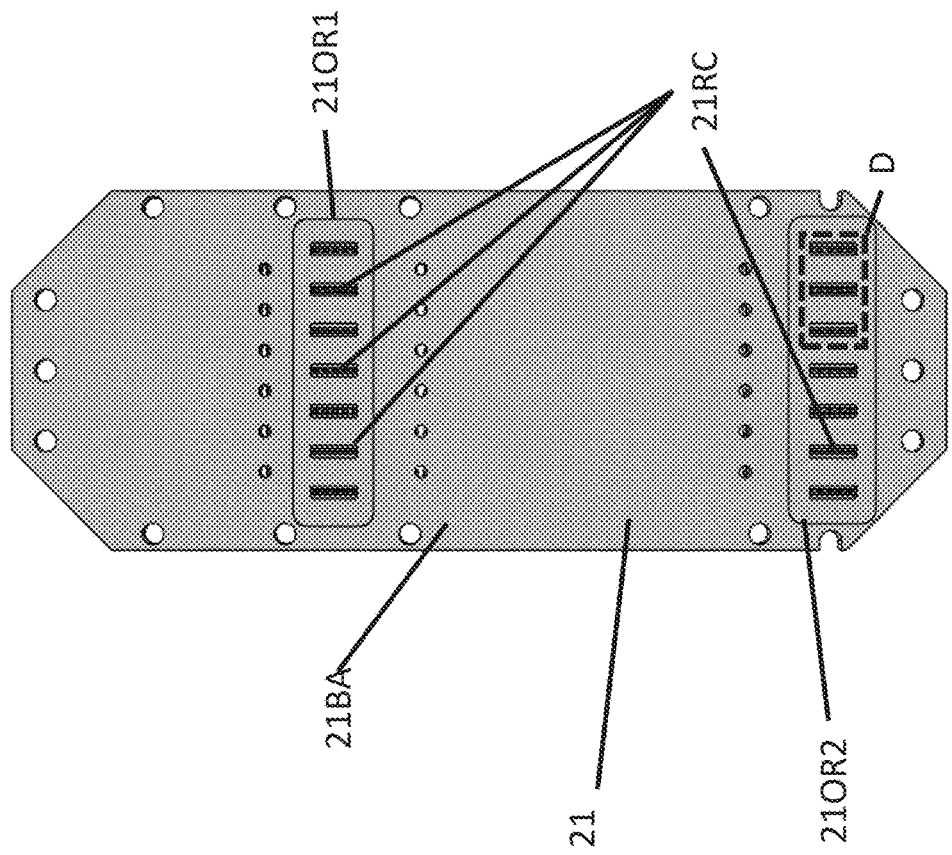
FIG. 9c illustrates a bottom view of the condenser of FIG. 9a, according to some example embodiments.
Figure 9F:
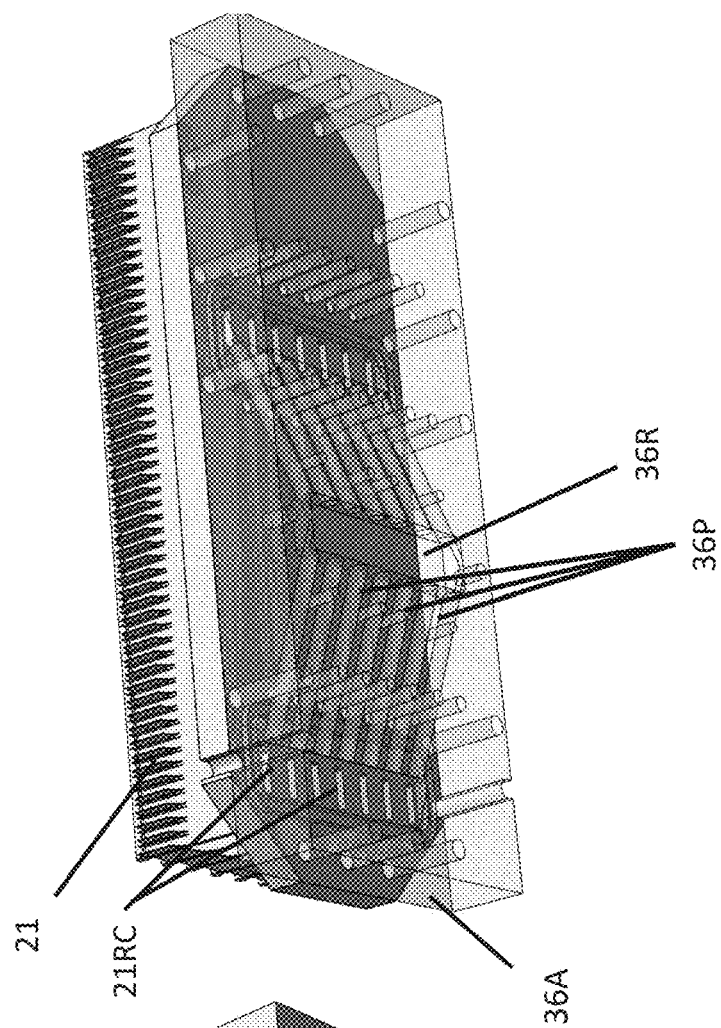
FIG. 9f illustrates a perspective view of the condenser with a see-through view of the collection manifold of FIG. 9a, according to some example embodiments.
Figure 9E:
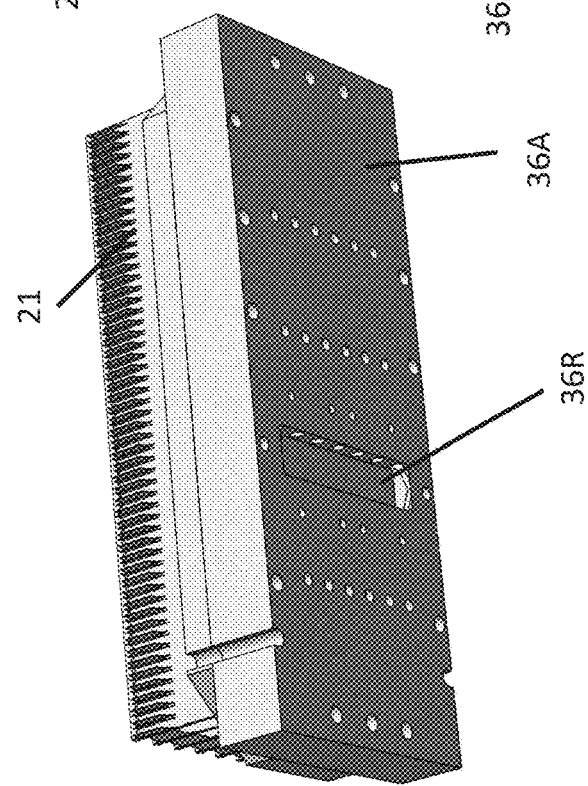
FIG. 9e illustrates a perspective view of the condenser and the collection manifold, according to some example embodiments.
Figure 9G:
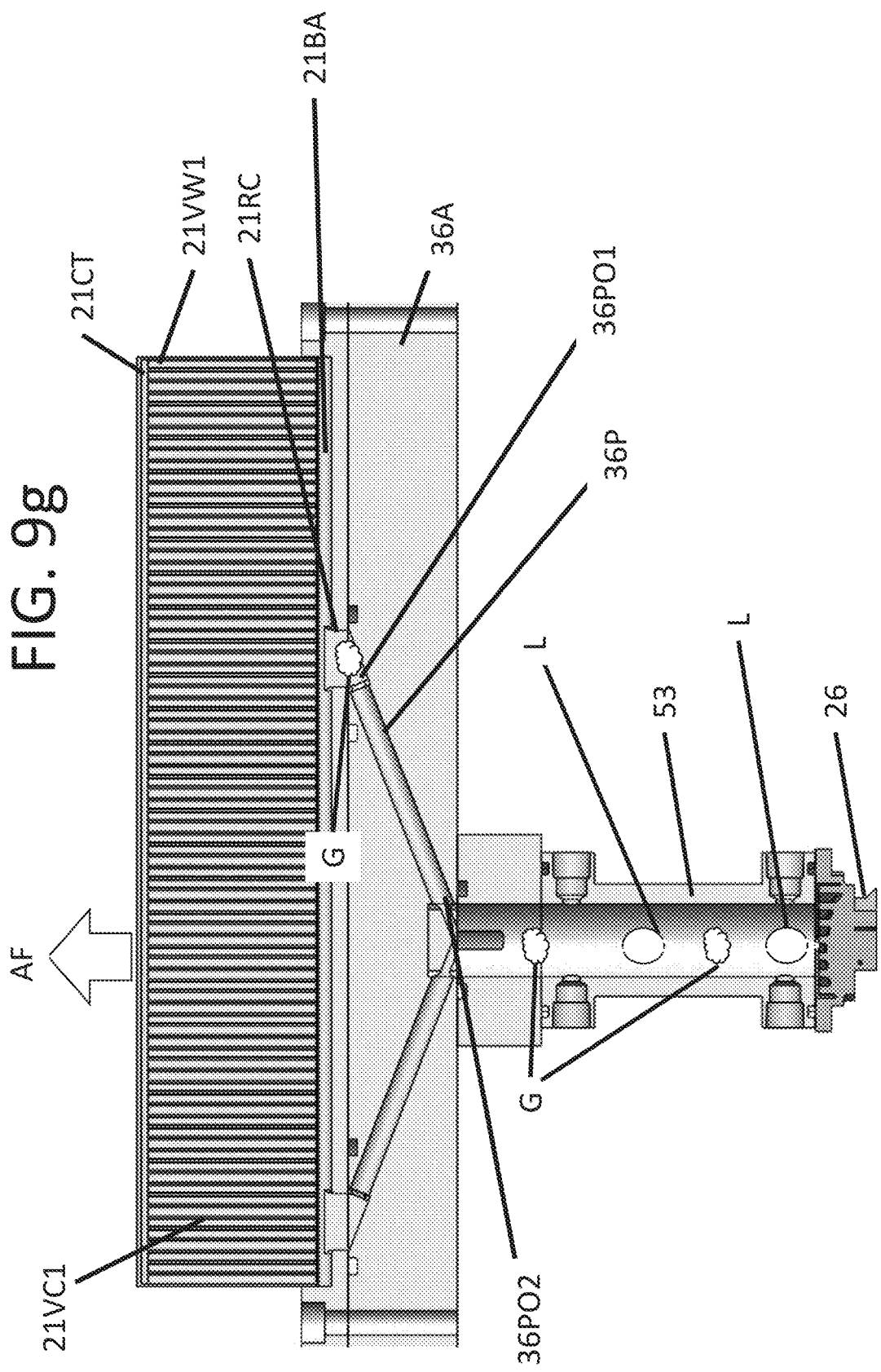
FIG. 9g illustrates a cross-sectional view of the condenser, the collection manifold, the connection, and the evaporator stack of FIG. 9a, according to some example embodiments.

FIG. 9a illustrates a perspective view of a condenser, a collection manifold, a connection, and an evaporator stack, according to some example embodiments. FIG. 9b illustrates a side view of the condenser, the collection manifold, the connection, and the evaporator stack of FIG. 9a, according to some example embodiments. FIG. 9c illustrates a bottom view of the condenser manifold of FIG. 9a, according to some example embodiments. FIG. 9d illustrates a zoom-in of the region labelled "D" of FIG. 9c, according to some example embodiments. FIG. 9e illustrates a perspective view of the condenser and the collection manifold, according to some example embodiments. FIG. 9f illustrates a perspective view of the condenser with a see-through view of the collection manifold of FIG. 9a, according to some example embodiments. FIG. 9g illustrates a cross-sectional view of the condenser, the collection manifold, the connection, and the evaporator stack of FIG. 9a, according to some example embodiments.

Referring to FIGS. 9a-9b, a condenser 21 may be situated on a collection manifold 36A. The condenser 21 may be or correspond to one of the condensers described above with respect to FIGS. 1a-8. The condenser 21 may include vertical walls 21VW and fins 21F.

The collection manifold 36A may correspond to the collection manifold 36 described above with reference to FIG. 8. Alternatively, the collection manifold 36A may not have sloped surfaces.

The condenser 21 may include a base 21BA. The base 21BA may be configured to be situated on top of the collection manifold 36A.

The collection manifold 36A may be situated on top of a connection 53. The connection 53 may be situated on top of an evaporator stack 26.

Referring to FIGS. 9c and 9d, within the base 21BA there may be a plurality of refrigerant channels 21RC. For example, there may be two sets of refrigerant channels 21RC within the base 21BA.

The refrigerant channels 21RC may allow for communication with, e.g. fluid communication with, vertical condensation chambers within the vertical walls 21VW of the condenser 21. For example, the refrigerant channels 21RC may be connected to, or in fluid communication with, the vertical condensation channels 26VC1, described with reference to FIG. 9g.

Around a first set of refrigerant channels 21RC, there may be a first O-ring 21OR1. Similarly, around a second set of refrigerant channels 21RC, there may be a second O-ring 21OR2. The first O-ring 21OR1 and the second O-ring 21OR2 may allow for a secure fit between the condenser 21 and the collection manifold 36A. The first O-ring 21OR1 and the second O-ring 21OR2 may provide a seal between the refrigerant channels 21RC and the vertical channels such as vertical channels 21VC1 within the vertical walls 21VW.

The refrigerant channels 21RC may enable fluid communication, e.g. both gas-phase and liquid-phase communication, between the collection manifold 36A and vertical channels within vertical walls of the condenser 21, e.g.

within the vertical channels 21VC1 within the first vertical wall 21VW1. The condenser 21 may correspond to one of the condensers described above with reference to FIGS. 1a-8.

Referring to FIG. 9e, at a bottom of the collection manifold 36A, there may be a recess 36R. The recess 36R may be a recess for accommodating a connection to an evaporator stack 26, such as the connection 53 to the evaporator stack 26 of FIG. 9a.

Referring to FIGS. 9f and 9g, within the collection manifold 36A there may be a number of connecting tubes 36P. Each of the connecting tubes 36P may have a first opening 36PO1 in fluid communication with a refrigerant channel 21RC, and may have a second opening 36PO2 in fluid communication with a recess 36R.

The collection manifold 36A may be connected to the connection 53 and/or directly to the evaporator stack 26. A semiconductor device (not shown) may generate heat during operation. The semiconductor device may heat the evaporator stack 26. The evaporator stack 26 may cause evaporation/boiling of a liquid-phase L of a coolant into a gas-phase G. The gas-phase G of the coolant may rise up, e.g. may rise up through the connection 53 into the second openings 36PO2 of the connection tube 36P. The gas-phase G of the coolant may enter the refrigerant channels 21RC through the first openings 36PO1, and may rise up through the vertical channels 21VC within the vertical walls 21VW. The coolant may be cooled by airflow, e.g. vertical airflow AF within the condenser 21 on opposite sides of the vertical wall 21VW than that of the vertical channels 21VC1, and condense back to a liquid-phase L within the vertical channels 21VC1, and may fall back through gravity to the evaporator stack 26.

Figure 10:
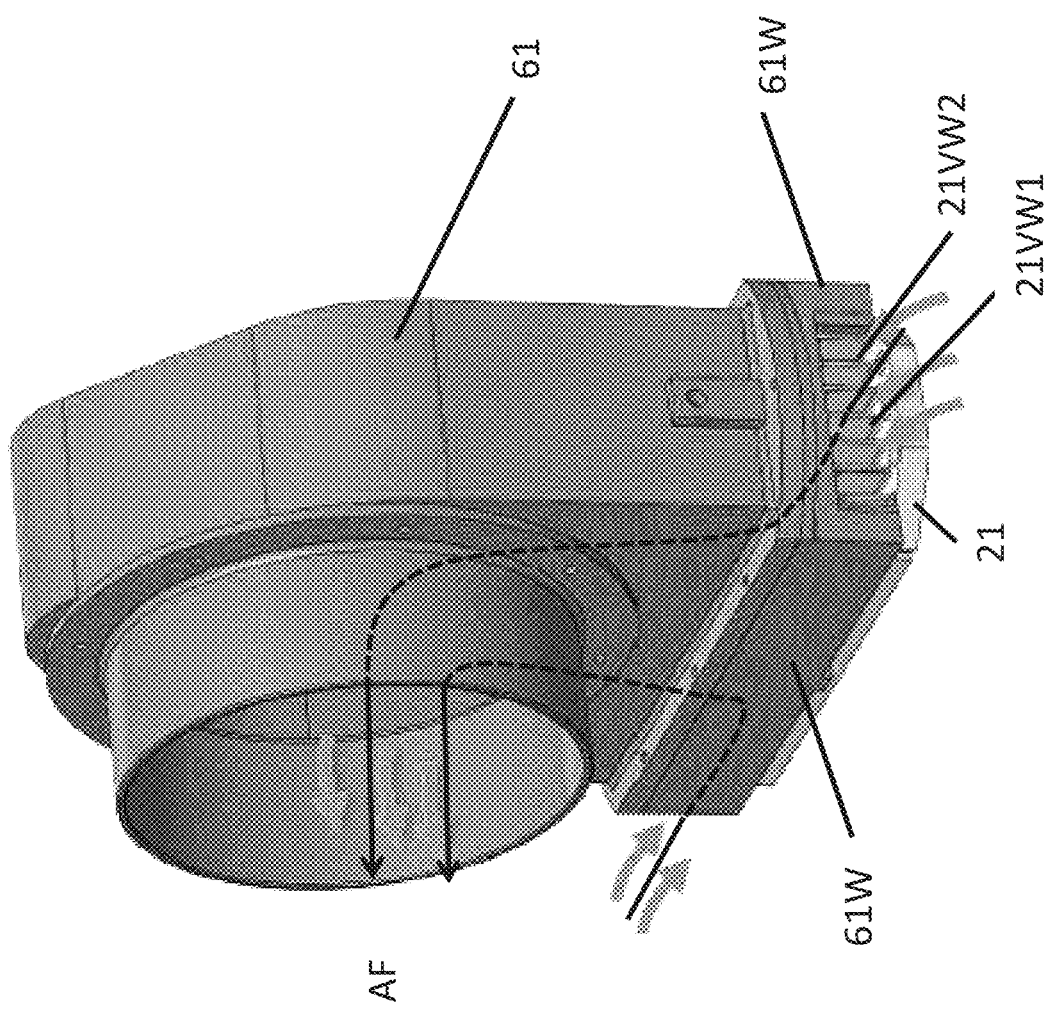
FIG. 10 illustrates an air manifold and a condenser, according to some example embodiments.

FIG. 10 is an illustration of a connection of an air manifold 61 and a condenser 21.

The example embodiment described with reference to FIG. 10 may be useful, for example, during testing, prototyping, and/or characterization of condensers and/or evaporators.

Referring to FIG. 10, the air manifold 61 may be situated on top of the condenser 21. There may be components 61W that surround vertical walls, such as vertical walls 21VW, of the condenser 21. The air manifold 61 may fit around the vertical walls 21VW of the condenser 21.

The air manifold 61 may generate airflow AF. The airflow AF may flow between vertical walls within the condenser 21, e.g. between vertical walls 21VW1 and vertical wall 21VW2.

As described above with reference to FIGS. 1a-10, there may be pumpless, passive evaporation and condensation of a coolant. Furthermore, use of the air manifold 61 may enable rapid characterization and prototyping of a condenser 21, according to some example embodiments.

Having described various example embodiments, it will become apparent that various modifications can be made without departing from the scope of the invention as defined in the accompanying claims.

What is claimed is:

1. A condenser comprising:
   a first vertical wall defining a first plurality of vertical condensation channels that extend in a vertical direction within the first vertical wall;
   a second vertical wall defining a second plurality of vertical condensation channels that extend in the vertical direction within the second vertical wall; and
   a first plurality of fins, each of the first plurality of fins connected to both the first vertical wall and the second vertical wall, wherein
   adjacent ones of the first plurality of fins create an airflow opening with surfaces of the first vertical wall and surfaces of the second vertical wall, the airflow opening extending in the vertical direction and configured to enable airflow along the vertical direction.

2. The condenser of claim 1, wherein
   the first plurality of vertical condensation channels are configured to enable condensation of a coolant, and
   the second plurality of vertical condensation channels are configured to enable condensation of the coolant.

3. The condenser of claim 1, wherein
   a height of the first vertical wall is greater than a height of at least one of the first plurality of fins.

4. The condenser of claim 1, wherein the adjacent ones of the first plurality of fins do not extend in a parallel horizontal direction.

5. The condenser of claim 1, wherein the adjacent ones of the first plurality of fins extend in a parallel horizontal direction.

6. The condenser of claim 1, further comprising:
   a third vertical wall extending in the vertical direction, the third vertical wall having a third plurality of vertical condensation channels; and
   a second plurality of fins extending in the vertical direction, each of the second plurality of fins connected to the second vertical wall and to the third vertical wall.

7. The condenser of claim 1, wherein the first vertical wall includes,
   a connection tube extending in a horizontal direction, the connection tube defining a hollow horizontal channel, the hollow horizontal channel enabling fluid communication between a first one of the first plurality of vertical condensation channels and a second one of the first plurality of vertical condensation channels.

8. The condenser of claim 1, wherein the first vertical wall, the second vertical wall, and the first plurality of fins are integral.

9. The condenser of claim 1, further comprising:
   a baffle connected to a bottom of the first vertical wall, the baffle having a surface that extends in a diagonal direction, the diagonal direction being diagonal with respect to the vertical direction.

10. A condenser comprising:
    a first vertical wall defining a first plurality of vertical condensation channels that extend in a vertical direction within the first vertical wall;
    a second vertical wall defining a second plurality of vertical condensation channels that extend in the vertical direction within the second vertical wall; and
    a first plurality of fins, wherein a first one of the first plurality of fins contacts the first vertical wall and does not contact the second vertical wall, a second one of the first plurality of fins contacts the second vertical wall and does not contact the first vertical wall, and the first one of the first plurality of fins contacts the second one of the first plurality of fins, and
    adjacent ones of the first plurality of fins create an airflow opening with surfaces of the first vertical wall, the airflow opening extending vertically and configured to enable airflow along the vertical direction.

11. The condenser of claim 10, further comprising:
    a first intermediate connection between the first vertical wall and the second vertical wall, wherein the first one of the first plurality of fins contacts the first intermediate connection and the first vertical wall, and the second one of the first plurality of fins contacts the first intermediate connection and the second vertical wall.

12. The condenser of claim 11, wherein a height of the first vertical wall is greater than a height of the first intermediate connection.

13. The condenser of claim 10, wherein the first vertical wall, the second vertical wall, and the plurality of fins include at least one of aluminum, copper-nickel alloys, brass, titanium, stainless steel, and ferritic stainless steel.

14. The condenser of claim 1, wherein adjacent ones of the first plurality of fins intersect to have a V-shape.

* * * * *